United States Patent
Sasaki et al.

(10) Patent No.: US 11,760,650 B2
(45) Date of Patent: Sep. 19, 2023

(54) COMPOUND

(71) Applicant: IDEMITSU KOSAN CO.,LTD., Tokyo (JP)

(72) Inventors: Kenichi Sasaki, Sodegaura (JP); Emi Kawashima, Sodegaura (JP); Kazuyoshi Inoue, Sodegaura (JP); Masatoshi Shibata, Sodegaura (JP); Atsushi Yao, Sodegaura (JP)

(73) Assignee: IDEMITSU KOSAN CO.,LTD., Tokyo (JP)

( * ) Notice: Subject to any disclaimer, the term of this patent is extended or adjusted under 35 U.S.C. 154(b) by 407 days.

(21) Appl. No.: 17/264,622

(22) PCT Filed: Aug. 1, 2019

(86) PCT No.: PCT/JP2019/030135
§ 371 (c)(1),
(2) Date: Jan. 29, 2021

(87) PCT Pub. No.: WO2020/027244
PCT Pub. Date: Feb. 6, 2020

(65) Prior Publication Data
US 2021/0309535 A1    Oct. 7, 2021

(30) Foreign Application Priority Data
Aug. 1, 2018 (JP) .................... 2018-145480

(51) Int. Cl.
*C01G 15/00* (2006.01)
(52) U.S. Cl.
CPC ......... *C01G 15/00* (2013.01); *C01P 2002/30* (2013.01); *C01P 2002/72* (2013.01)

(58) Field of Classification Search
CPC ..................................................... C01G 15/00
See application file for complete search history.

(56) References Cited

U.S. PATENT DOCUMENTS

| 2016/0149005 A1 | 5/2016 | Oda et al. |
| 2017/0345653 A1 | 11/2017 | Nishimura et al. |
| 2018/0226472 A1 | 8/2018 | Oda et al. |

FOREIGN PATENT DOCUMENTS

| WO | WO-2015/005202 A1 | 1/2015 |
| WO | WO-2016/084636 A1 | 6/2016 |

OTHER PUBLICATIONS

International Searching Authority, "International Preliminary Report on Patentability," issued in connection with International Patent Application No. PCT/JP2019/030135, dated Feb. 2, 2021.
International Searching Authority, "International Search Report," issued in connection with International Patent Application No. PCT/JP2019/030135, dated Oct. 29, 2019.
International Searching Authority, "Written Opinion," issued in connection with International Patent Application No. PCT/JP2019/030135, dated Oct. 29, 2019.

*Primary Examiner* — James A Fiorito
(74) *Attorney, Agent, or Firm* — Foley & Lardner LLP

(57) ABSTRACT

A compound includes indium element (In), gallium element (Ga), aluminum element (Al) and oxygen element (O), the compound having a triclinic crystal system with lattice constants being a=10.07±0.15 Å, b=10.45±0.15 Å, c=11.01±0.15 Å, α=111.70±0.50°, β=107.70±0.50° and γ=90.00±0.50°.

4 Claims, 3 Drawing Sheets

PRECESSION PHOTOGRAPH OF (H K L) = (10.12, 0.00, 2.09) PLANE

PRECESSION PHOTOGRAPH OF (H K L) = (10.12, 0.00, 2.09) PLANE

PRECESSION PHOTOGRAPH OF (H K L) = (11.95, −7.08, 0.00) PLANE

COMPOUND

CROSS-REFERENCE TO RELATED APPLICATIONS

The present application claims priority under 37 U.S.C. § 371 to International Patent Application No. PCT/JP2019/030135, filed Aug. 1, 2019, which claims priority to and the benefit of Japanese Patent Application No. 2018-145480, filed on Aug. 1, 2018. The contents of these applications are hereby incorporated by reference in their entireties.

TECHNICAL FIELD

The present invention relates to a compound.

BACKGROUND ART

An oxide semiconductor usable for a thin-film transistor has higher carrier mobility than general-purpose amorphous silicon (occasionally abbreviated as a-Si), has a large optical band gap, and can be deposited at low temperatures. Accordingly, the use of the oxide semiconductor is expected in the field of next-generation display devices requiring a high-resolution and high-speed large-size image display, and a resin substrate with low heat resistance. The oxide semiconductor (film) is suitably formed through a sputtering method, in which a sputtering target is sputtered. This is because a thin film formed through the sputtering method is more excellent in terms of in-plane uniformity (e.g., composition uniformity in a film plane direction (i.e., within a film plane) and even film thickness) than a thin film formed through an ion-plating method, a vacuum deposition method or an electron beam deposition method, allowing for the formation of the thin film with the same composition as that of the sputtering target.

Patent Literature 1 discloses an oxide sintered body consisting of indium oxide, gallium oxide and aluminum oxide, where: the content of gallium represented by Ga/(In+Ga) (atom number ratio) is in a range from 0.15 to 0.49; the content of aluminum represented by Al/(In+Ga+Al) (atom number ratio) is 0.0001 or more and less than 0.25; and the oxide sintered body includes an $In_2O_3$ phase of Bixbyite structure, and generated phase other than the $In_2O_3$ phase including $GaInO_3$ phase of $\beta$-$Ga_2O_3$ structure, or $GaInO_3$ phase of $\beta$-$Ga_2O_3$ structure and $(Ga, In)_2O_3$ phase. Patent Literature 1 also discloses that in a case where a mixture of Ga (20 at % in an added amount) and Al (1 at % in the added amount) and a mixture of Ga (25 at % in an added amount) and Al (5 at % in the added amount) are each calcined at a temperature of 1400 degrees C. for 20 hours, it has been found from an XRD chart that the $In_2O_3$ phase and the $GaInO_3$ phase are deposited.

CITATION LIST

Patent Literature(s)

Patent Literature 1: WO2016/084636 A1

SUMMARY OF THE INVENTION

Problem(s) to be Solved by the Invention

When an oxide compound is applied to a semiconductor device such as a transistor or a diode, leakage current from the semiconductor device is low due to a large band gap of the oxide compound. However, the large band gap causes the oxide compound to be unable to stably control carrier concentration or obtain sufficient conductivity when used as a semiconductor. Accordingly, there is a demand for a novel compound that solves the above-described problems. Specifically, a compound usable to prepare an oxide semiconductor material whose band gap is sufficiently large compared with a typical Si semiconductor has been desired.

An object of the invention is to provide a compound usable to prepare an oxide semiconductor material whose band gap is sufficiently large compared with a typical Si semiconductor.

Means for Solving the Problem(s)

According to an aspect of the invention, the following compound is provided.

[1] A compound including indium element (In), gallium element (Ga), aluminum element (Al) and oxygen element (O), the compound having a triclinic crystal system with lattice constants, in which the lattice constants are
a=10.07±0.15 Å,
b=10.45±0.15 Å,
c=11.01±0.15 Å,
α=111.70±0.50°,
β=107.70±0.50° and
γ=90.00±0.50°.

[2] The compound according to [1], in which the compound has a space group of P-1 or P1.

[3] The compound according to [1], in which the compound has a space group of P-1 and an atomic configuration below, at least one metal in the atomic configuration is any one of In, Ga and Al, or any two or more of In, Ga and Al, and is on the same atomic coordinates at a predetermined ratio, the atomic coordinates on which the at least one metal is arranged are in a range of
x±0.01,
y±0.01, and
z±0.01, and atomic coordinates on which oxygen is arranged are in a range of
x±0.01,
y±0.01, and
z±0.01, where atomic species: metal, atomic coordinates (x=0.04, y=0.36, z=0.87),
atomic species: metal, atomic coordinates (x=0.13, y=0.12, z=0.62),
atomic species: metal, atomic coordinates (x=0.21, y=0.85, z=0.39),
atomic species: metal, atomic coordinates (x=0.23, y=0.11, z=0.97),
atomic species: metal, atomic coordinates (x=0.29, y=0.64, z=0.11),
atomic species: metal, atomic coordinates (x=0.46, y=0.12, z=0.63),
atomic species: metal, atomic coordinates (x=0.58, y=0.14, z=0.01),
atomic species: metal, atomic coordinates (x=0.62, y=0.64, z=0.11),
atomic species: metal, atomic coordinates (x=0.69, y=0.18, z=0.32),
atomic species: metal, atomic coordinates (x=0.09, y=0.88, z=0.03),
atomic species: metal, atomic coordinates (x=0.02, y=0.13, z=0.30), atomic species: metal, atomic coordinates (x=0.06, y=0.61, z=0.46),
atomic species: metal, atomic coordinates (x=0.15, y=0.40, z=0.19),
atomic species: metal, atomic coordinates (x=0.26, y=0.36, z=0.54),
atomic species: metal, atomic coordinates (x=0.34, y=0.13, z=0.30),
atomic species: metal, atomic coordinates (x=0.41, y=0.61, z=0.45),
atomic species: metal, atomic coordinates (x=0.48, y=0.40, z=0.23),
atomic species: metal, atomic coordinates (x=0.84, y=0.39, z=0.23),
atomic species: oxygen, atomic coordinates (x=0.02, y=0.73, z=0.36),
atomic species: oxygen, atomic coordinates (x=0.03, y=0.45, z=0.29),
atomic species: oxygen, atomic coordinates (x=0.05, y=0.02, z=0.40),
atomic species: oxygen, atomic coordinates (x=0.10, y=0.74, z=0.65),
atomic species: oxygen, atomic coordinates (x=0.10, y=0.23, z=0.06),
atomic species: oxygen, atomic coordinates (x=0.12, y=0.51, z=0.09),
atomic species: oxygen, atomic coordinates (x=0.12, y=0.47, z=0.57),
atomic species: oxygen, atomic coordinates (x=0.13, y=0.79, z=0.17),
atomic species: oxygen, atomic coordinates (x=0.19, y=0.21, z=0.84),
atomic species: oxygen, atomic coordinates (x=0.20, y=0.23, z=0.36),
atomic species: oxygen, atomic coordinates (x=0.25, y=0.66, z=0.49),
atomic species: oxygen, atomic coordinates (x=0.27, y=0.02, z=0.12),
atomic species: oxygen, atomic coordinates (x=0.30, y=0.26, z=0.65),
atomic species: oxygen, atomic coordinates (x=0.33, y=0.44, z=0.29),
atomic species: oxygen, atomic coordinates (x=0.38, y=0.02, z=0.40),
atomic species: oxygen, atomic coordinates (x=0.39, y=0.73, z=0.35),
atomic species: oxygen, atomic coordinates (x=0.41, y=0.24, z=0.07),
atomic species: oxygen, atomic coordinates (x=0.43, y=0.47, z=0.57),
atomic species: oxygen, atomic coordinates (x=0.46, y=0.51, z=0.11),
atomic species: oxygen, atomic coordinates (x=0.47, y=0.79, z=0.15),
atomic species: oxygen, atomic coordinates (x=0.50, y=0.25, z=0.36),
atomic species: oxygen, atomic coordinates (x=0.64, y=0.03, z=0.12),
atomic species: oxygen, atomic coordinates (x=0.66, y=0.34, z=0.23),
atomic species: oxygen, atomic coordinates (x=0.72, y=0.03, z=0.40),
atomic species: oxygen, atomic coordinates (x=0.78, y=0.51, z=0.12),
atomic species: oxygen, atomic coordinates (x=0.80, y=0.25, z=0.06), and
atomic species: oxygen, atomic coordinates (x=0.96, y=0.02, z=0.12).

[4] The compound according to [1], in which the compound has a space group of P1 and an atomic configuration below,
  at least one metal in the atomic configuration is any one of In, Ga and Al, or any two or more of In, Ga and Al, and is on the same atomic coordinates at a predetermined ratio,
  the atomic coordinates on which the at least one metal is arranged are in a range of
  x±0.01,
  y±0.01, and
  z±0.01, and
  atomic coordinates on which oxygen is arranged are in a range of
  x±0.01,
  y±0.01, and
  z±0.01, where
atomic species: metal, atomic coordinates (x=0.04, y=0.36, z=0.87),
atomic species: metal, atomic coordinates (x=0.13, y=0.12, z=0.62),
atomic species: metal, atomic coordinates (x=0.21, y=0.85, z=0.39),
atomic species: metal, atomic coordinates (x=0.23, y=0.11, z=0.97),
atomic species: metal, atomic coordinates (x=0.29, y=0.64, z=0.11),
atomic species: metal, atomic coordinates (x=0.46, y=0.12, z=0.63),
atomic species: metal, atomic coordinates (x=0.58, y=0.14, z=0.01),
atomic species: metal, atomic coordinates (x=0.62, y=0.64, z=0.11),
atomic species: metal, atomic coordinates (x=0.69, y=0.18, z=0.32),
atomic species: metal, atomic coordinates (x=0.09, y=0.88, z=0.03),
atomic species: metal, atomic coordinates (x=0.02, y=0.13, z=0.30),
atomic species: metal, atomic coordinates (x=0.06, y=0.61, z=0.46),
atomic species: metal, atomic coordinates (x=0.15, y=0.40, z=0.19),
atomic species: metal, atomic coordinates (x=0.26, y=0.36, z=0.54),
atomic species: metal, atomic coordinates (x=0.34, y=0.13, z=0.30),
atomic species: metal, atomic coordinates (x=0.41, y=0.61, z=0.45),
atomic species: metal, atomic coordinates (x=0.48, y=0.40, z=0.23),
atomic species: metal, atomic coordinates (x=0.84, y=0.39, z=0.23),
atomic species: metal, atomic coordinates (x=0.96, y=0.64, z=0.13),
atomic species: metal, atomic coordinates (x=0.87, y=0.88, z=0.38),
atomic species: metal, atomic coordinates (x=0.79, y=0.15, z=0.61),
atomic species: metal, atomic coordinates (x=0.77, y=0.89, z=0.03),
atomic species: metal, atomic coordinates (x=0.71, y=0.36, z=0.89),
atomic species: metal, atomic coordinates (x=0.54, y=0.88, z=0.37),
atomic species: metal, atomic coordinates (x=0.42, y=0.86, z=0.99), atomic species: metal, atomic coordinates (x=0.38, y=0.36, z=0.89),
atomic species: metal, atomic coordinates (x=0.31, y=0.82, z=0.68),
atomic species: metal, atomic coordinates (x=0.91, y=0.12, z=0.97),
atomic species: metal, atomic coordinates (x=0.98, y=0.87, z=0.70),
atomic species: metal, atomic coordinates (x=0.94, y=0.39, z=0.54),
atomic species: metal, atomic coordinates (x=0.85, y=0.60, z=0.81),
atomic species: metal, atomic coordinates (x=0.74, y=0.64, z=0.46),
atomic species: metal, atomic coordinates (x=0.66, y=0.87, z=0.70),
atomic species: metal, atomic coordinates (x=0.59, y=0.39, z=0.55),
atomic species: metal, atomic coordinates (x=0.52, y=0.60, z=0.77),
atomic species: metal, atomic coordinates (x=0.16, y=0.61, z=0.77),
atomic species: oxygen, atomic coordinates (x=0.02, y=0.73, z=0.36),
atomic species: oxygen, atomic coordinates (x=0.03, y=0.45, z=0.29),
atomic species: oxygen, atomic coordinates (x=0.05, y=0.02, z=0.40),
atomic species: oxygen, atomic coordinates (x=0.10, y=0.74, z=0.65),
atomic species: oxygen, atomic coordinates (x=0.10, y=0.23, z=0.06),
atomic species: oxygen, atomic coordinates (x=0.12, y=0.51, z=0.09),
atomic species: oxygen, atomic coordinates (x=0.12, y=0.47, z=0.57),
atomic species: oxygen, atomic coordinates (x=0.13, y=0.79, z=0.17),
atomic species: oxygen, atomic coordinates (x=0.19, y=0.21, z=0.84),
atomic species: oxygen, atomic coordinates (x=0.20, y=0.23, z=0.36),
atomic species: oxygen, atomic coordinates (x=0.25, y=0.66, z=0.49),
atomic species: oxygen, atomic coordinates (x=0.27, y=0.02, z=0.12),
atomic species: oxygen, atomic coordinates (x=0.30, y=0.26, z=0.65),
atomic species: oxygen, atomic coordinates (x=0.33, y=0.44, z=0.29),
atomic species: oxygen, atomic coordinates (x=0.38, y=0.02, z=0.40),
atomic species: oxygen, atomic coordinates (x=0.39, y=0.73, z=0.35),
atomic species: oxygen, atomic coordinates (x=0.41, y=0.24, z=0.07),
atomic species: oxygen, atomic coordinates (x=0.43, y=0.47, z=0.57),
atomic species: oxygen, atomic coordinates (x=0.46, y=0.51, z=0.11),
atomic species: oxygen, atomic coordinates (x=0.47, y=0.79, z=0.15),
atomic species: oxygen, atomic coordinates (x=0.50, y=0.25, z=0.36),
atomic species: oxygen, atomic coordinates (x=0.64, y=0.03, z=0.12),
atomic species: oxygen, atomic coordinates (x=0.66, y=0.34, z=0.23),
atomic species: oxygen, atomic coordinates (x=0.72, y=0.03, z=0.40),
atomic species: oxygen, atomic coordinates (x=0.78, y=0.51, z=0.12),
atomic species: oxygen, atomic coordinates (x=0.80, y=0.25, z=0.06),
atomic species: oxygen, atomic coordinates (x=0.96, y=0.02, z=0.12),
atomic species: oxygen, atomic coordinates (x=0.98, y=0.27, z=0.64),
atomic species: oxygen, atomic coordinates (x=0.97, y=0.55, z=0.72),
atomic species: oxygen, atomic coordinates (x=0.95, y=0.98, z=0.60),
atomic species: oxygen, atomic coordinates (x=0.90, y=0.26, z=0.35),
atomic species: oxygen, atomic coordinates (x=0.90, y=0.77, z=0.94),
atomic species: oxygen, atomic coordinates (x=0.88, y=0.49, z=0.91),
atomic species: oxygen, atomic coordinates (x=0.88, y=0.53, z=0.43),
atomic species: oxygen, atomic coordinates (x=0.87, y=0.21, z=0.83),
atomic species: oxygen, atomic coordinates (x=0.81, y=0.79, z=0.16),
atomic species: oxygen, atomic coordinates (x=0.80, y=0.77, z=0.64),
atomic species: oxygen, atomic coordinates (x=0.75, y=0.34, z=0.51),
atomic species: oxygen, atomic coordinates (x=0.73, y=0.98, z=0.88),
atomic species: oxygen, atomic coordinates (x=0.70, y=0.74, z=0.35),
atomic species: oxygen, atomic coordinates (x=0.67, y=0.56, z=0.71),
atomic species: oxygen, atomic coordinates (x=0.62, y=0.98, z=0.60),
atomic species: oxygen, atomic coordinates (x=0.61, y=0.27, z=0.65),
atomic species: oxygen, atomic coordinates (x=0.59, y=0.76, z=0.93),
atomic species: oxygen, atomic coordinates (x=0.58, y=0.53, z=0.43),
atomic species: oxygen, atomic coordinates (x=0.54, y=0.49, z=0.89),
atomic species: oxygen, atomic coordinates (x=0.53, y=0.21, z=0.85),
atomic species: oxygen, atomic coordinates (x=0.50, y=0.75, z=0.64),
atomic species: oxygen, atomic coordinates (x=0.36, y=0.97, z=0.88),
atomic species: oxygen, atomic coordinates (x=0.34, y=0.66, z=0.77),
atomic species: oxygen, atomic coordinates (x=0.28, y=0.97, z=0.60),
atomic species: oxygen, atomic coordinates (x=0.22, y=0.49, z=0.88),
atomic species: oxygen, atomic coordinates (x=0.20, y=0.75, z=0.94), and
atomic species: oxygen, atomic coordinates (x=0.04, y=0.98, z=0.88).

[5] The compound according to [1], in which the compound has a space group of P-1 and an atomic configuration below, at least one metal in the atomic configuration is any one of In, Ga and Al, or any two or more of In, Ga and Al, and is on the same atomic coordinates at a predetermined ratio, the atomic coordinates on which the at least one metal is arranged are in a range of x±0.01,
y±0.01, and
z±0.01, and atomic coordinates on which oxygen is arranged are in a range of x±0.01,
y±0.01, and
z±0.01, where atomic species: metal, atomic coordinates (x=0.04478, y=0.36228, z=0.86934),
atomic species: metal, atomic coordinates (x=0.12677, y=0.11682, z=0.62279),
atomic species: metal, atomic coordinates (x=0.21268, y=0.8504, z=0.38665),
atomic species: metal, atomic coordinates (x=0.23283, y=0.11047, z=0.97132),
atomic species: metal, atomic coordinates (x=0.28695, y=0.64349, z=0.10627),
atomic species: metal, atomic coordinates (x=0.45663, y=0.11849, z=0.62655),
atomic species: metal, atomic coordinates (x=0.58343, y=0.14455, z=0.0065),
atomic species: metal, atomic coordinates (x=0.62181, y=0.6417, z=0.10725),
atomic species: metal, atomic coordinates (x=0.68785, y=0.18413, z=0.31614),
atomic species: metal, atomic coordinates (x=0.08662, y=0.88097, z=0.03282),
atomic species: metal, atomic coordinates (x=0.02388, y=0.13328, z=0.30129),
atomic species: metal, atomic coordinates (x=0.0627, y=0.6051, z=0.4561),
atomic species: metal, atomic coordinates (x=0.1503, y=0.3962, z=0.1949),
atomic species: metal, atomic coordinates (x=0.2624, y=0.36429, z=0.5374),
atomic species: metal, atomic coordinates (x=0.34051, y=0.1304, z=0.29845),
atomic species: metal, atomic coordinates (x=0.4081, y=0.6082, z=0.4509),
atomic species: metal, atomic coordinates (x=0.4821, y=0.39651, z=0.22899),
atomic species: metal, atomic coordinates (x=0.8369, y=0.39245, z=0.23049),
atomic species: oxygen, atomic coordinates (x=0.0157, y=0.7332, z=0.3627),
atomic species: oxygen, atomic coordinates (x=0.0295, y=0.4499, z=0.285),
atomic species: oxygen, atomic coordinates (x=0.0518, y=0.0204, z=0.4013),
atomic species: oxygen, atomic coordinates (x=0.0975, y=0.7442, z=0.6484),
atomic species: oxygen, atomic coordinates (x=0.1004, y=0.231, z=0.0611),
atomic species: oxygen, atomic coordinates (x=0.121, y=0.5054, z=0.0929),
atomic species: oxygen, atomic coordinates (x=0.1218, y=0.4677, z=0.5675),
atomic species: oxygen, atomic coordinates (x=0.1323, y=0.7893, z=0.17),
atomic species: oxygen, atomic coordinates (x=0.1917, y=0.2052, z=0.837),
atomic species: oxygen, atomic coordinates (x=0.1998, y=0.2293, z=0.3578),
atomic species: oxygen, atomic coordinates (x=0.2461, y=0.6607, z=0.4873),
atomic species: oxygen, atomic coordinates (x=0.2703, y=0.0197, z=0.1161),
atomic species: oxygen, atomic coordinates (x=0.2975, y=0.2578, z=0.6451),
atomic species: oxygen, atomic coordinates (x=0.3274, y=0.4429, z=0.2908),
atomic species: oxygen, atomic coordinates (x=0.38, y=0.017, z=0.3996),
atomic species: oxygen, atomic coordinates (x=0.3852, y=0.7303, z=0.3495),
atomic species: oxygen, atomic coordinates (x=0.4077, y=0.2385, z=0.0657),
atomic species: oxygen, atomic coordinates (x=0.425, y=0.4654, z=0.5745),
atomic species: oxygen, atomic coordinates (x=0.4569, y=0.5063, z=0.1142),
atomic species: oxygen, atomic coordinates (x=0.472, y=0.7862, z=0.1502),
atomic species: oxygen, atomic coordinates (x=0.50, y=0.2483, z=0.3581),
atomic species: oxygen, atomic coordinates (x=0.6404, y=0.0285, z=0.122),
atomic species: oxygen, atomic coordinates (x=0.6587, y=0.3356, z=0.2257),
atomic species: oxygen, atomic coordinates (x=0.7171, y=0.0302, z=0.3985),
atomic species: oxygen, atomic coordinates (x=0.7808, y=0.5096, z=0.1234),
atomic species: oxygen, atomic coordinates (x=0.8007, y=0.2465, z=0.0562), and
atomic species: oxygen, atomic coordinates (x=0.9644, y=0.0248, z=0.117).

[6] The compound according to [1], in which the compound has a space group of P1 and an atomic configuration below, at least one metal in the atomic configuration is any one of In, Ga and Al, or any two or more of In, Ga and Al, and is on the same atomic coordinates at a predetermined ratio, the atomic coordinates on which the at least one metal is arranged are in a range of x±0.01,
y±0.01, and
z±0.01, and atomic coordinates on which oxygen is arranged are in a range of x±0.01,
y±0.01, and
z±0.01, where atomic species: metal, atomic coordinates (x=0.04478, y=0.36228, z=0.86934),
atomic species: metal, atomic coordinates (x=0.12677, y=0.11682, z=0.62279),
atomic species: metal, atomic coordinates (x=0.21268, y=0.8504, z=0.38665),
atomic species: metal, atomic coordinates (x=0.23283, y=0.11047, z=0.97132),
atomic species: metal, atomic coordinates (x=0.28695, y=0.64349, z=0.10627),
atomic species: metal, atomic coordinates (x=0.45663, y=0.11849, z=0.62655),
atomic species: metal, atomic coordinates (x=0.58343, y=0.14455, z=0.0065),
atomic species: metal, atomic coordinates (x=0.62181, y=0.6417, z=0.10725), atomic species: metal, atomic coordinates (x=0.68785, y=0.18413, z=0.31614),
atomic species: metal, atomic coordinates (x=0.08662, y=0.88097, z=0.03282),
atomic species: metal, atomic coordinates (x=0.02388, y=0.13328, z=0.30129),
atomic species: metal, atomic coordinates (x=0.0627, y=0.6051, z=0.4561),
atomic species: metal, atomic coordinates (x=0.1503, y=0.3962, z=0.1949),
atomic species: metal, atomic coordinates (x=0.2624, y=0.36429, z=0.5374),
atomic species: metal, atomic coordinates (x=0.34051, y=0.1304, z=0.29845),
atomic species: metal, atomic coordinates (x=0.4081, y=0.6082, z=0.4509),
atomic species: metal, atomic coordinates (x=0.4821, y=0.39651, z=0.22899),
atomic species: metal, atomic coordinates (x=0.8369, y=0.39245, z=0.23049),
atomic species: metal, atomic coordinates (x=0.95522, y=0.63772, z=0.13066),
atomic species: metal, atomic coordinates (x=0.87323, y=0.88318, z=0.37721),
atomic species: metal, atomic coordinates (x=0.78732, y=0.1496, z=0.61335),
atomic species: metal, atomic coordinates (x=0.76717, y=0.88953, z=0.02868),
atomic species: metal, atomic coordinates (x=0.71305, y=0.35651, z=0.89373),
atomic species: metal, atomic coordinates (x=0.54337, y=0.88151, z=0.37345),
atomic species: metal, atomic coordinates (x=0.41657, y=0.85545, z=0.9935),
atomic species: metal, atomic coordinates (x=0.37819, y=0.3583, z=0.89275),
atomic species: metal, atomic coordinates (x=0.31215, y=0.81587, z=0.68386),
atomic species: metal, atomic coordinates (x=0.91338, y=0.11903, z=0.96718),
atomic species: metal, atomic coordinates (x=0.97612, y=0.86672, z=0.69871),
atomic species: metal, atomic coordinates (x=0.9373, y=0.3949, z=0.5439),
atomic species: metal, atomic coordinates (x=0.8497, y=0.6038, z=0.8051),
atomic species: metal, atomic coordinates (x=0.7376, y=0.63571, z=0.4626),
atomic species: metal, atomic coordinates (x=0.65949, y=0.8696, z=0.70155),
atomic species: metal, atomic coordinates (x=0.5919, y=0.3918, z=0.5491),
atomic species: metal, atomic coordinates (x=0.5179, y=0.60349, z=0.77101),
atomic species: metal, atomic coordinates (x=0.1631, y=0.60755, z=0.76951),
atomic species: oxygen, atomic coordinates (x=0.0157, y=0.7332, z=0.3627),
atomic species: oxygen, atomic coordinates (x=0.0295, y=0.4499, z=0.285),
atomic species: oxygen, atomic coordinates (x=0.0518, y=0.0204, z=0.4013),
atomic species: oxygen, atomic coordinates (x=0.0975, y=0.7442, z=0.6484),
atomic species: oxygen, atomic coordinates (x=0.1004, y=0.231, z=0.0611),
atomic species: oxygen, atomic coordinates (x=0.121, y=0.5054, z=0.0929),
atomic species: oxygen, atomic coordinates (x=0.1218, y=0.4677, z=0.5675),
atomic species: oxygen, atomic coordinates (x=0.1323, y=0.7893, z=0.17),
atomic species: oxygen, atomic coordinates (x=0.1917, y=0.2052, z=0.837),
atomic species: oxygen, atomic coordinates (x=0.1998, y=0.2293, z=0.3578),
atomic species: oxygen, atomic coordinates (x=0.2461, y=0.6607, z=0.4873),
atomic species: oxygen, atomic coordinates (x=0.2703, y=0.0197, z=0.1161),
atomic species: oxygen, atomic coordinates (x=0.2975, y=0.2578, z=0.6451),
atomic species: oxygen, atomic coordinates (x=0.3274, y=0.4429, z=0.2908),
atomic species: oxygen, atomic coordinates (x=0.38, y=0.017, z=0.3996),
atomic species: oxygen, atomic coordinates (x=0.3852, y=0.7303, z=0.3495),
atomic species: oxygen, atomic coordinates (x=0.4077, y=0.2385, z=0.0657),
atomic species: oxygen, atomic coordinates (x=0.425, y=0.4654, z=0.5745),
atomic species: oxygen, atomic coordinates (x=0.4569, y=0.5063, z=0.1142),
atomic species: oxygen, atomic coordinates (x=0.472, y=0.7862, z=0.1502),
atomic species: oxygen, atomic coordinates (x=0.50, y=0.2483, z=0.3581),
atomic species: oxygen, atomic coordinates (x=0.6404, y=0.0285, z=0.122),
atomic species: oxygen, atomic coordinates (x=0.6587, y=0.3356, z=0.2257),
atomic species: oxygen, atomic coordinates (x=0.7171, y=0.0302, z=0.3985),
atomic species: oxygen, atomic coordinates (x=0.7808, y=0.5096, z=0.1234),
atomic species: oxygen, atomic coordinates (x=0.8007, y=0.2465, z=0.0562),
atomic species: oxygen, atomic coordinates (x=0.9644, y=0.0248, z=0.117),
atomic species: oxygen, atomic coordinates (x=0.9843, y=0.2668, z=0.6373),
atomic species: oxygen, atomic coordinates (x=0.9705, y=0.5501, z=0.715),
atomic species: oxygen, atomic coordinates (x=0.9482, y=0.9796, z=0.5987),
atomic species: oxygen, atomic coordinates (x=0.9025, y=0.2558, z=0.3516),
atomic species: oxygen, atomic coordinates (x=0.8996, y=0.769, z=0.9389),
atomic species: oxygen, atomic coordinates (x=0.879, y=0.4946, z=0.9071),
atomic species: oxygen, atomic coordinates (x=0.8782, y=0.5323, z=0.4325),
atomic species: oxygen, atomic coordinates (x=0.8677, y=0.2107, z=0.83),
atomic species: oxygen, atomic coordinates (x=0.8083, y=0.7948, z=0.163),
atomic species: oxygen, atomic coordinates (x=0.8002, y=0.7707, z=0.6422),
atomic species: oxygen, atomic coordinates (x=0.7539, y=0.3393, z=0.5127), atomic species: oxygen, atomic coordinates (x=0.7297, y=0.9803, z=0.8839),
atomic species: oxygen, atomic coordinates (x=0.7025, y=0.7422, z=0.3549),
atomic species: oxygen, atomic coordinates (x=0.6726, y=0.5571, z=0.7092),
atomic species: oxygen, atomic coordinates (x=0.62, y=0.983, z=0.6004),
atomic species: oxygen, atomic coordinates (x=0.6148, y=0.2697, z=0.6505),
atomic species: oxygen, atomic coordinates (x=0.5923, y=0.7615, z=0.9343),
atomic species: oxygen, atomic coordinates (x=0.575, y=0.5346, z=0.4255),
atomic species: oxygen, atomic coordinates (x=0.5431, y=0.4937, z=0.8858),
atomic species: oxygen, atomic coordinates (x=0.528, y=0.2138, z=0.8498),
atomic species: oxygen, atomic coordinates (x=0.5, y=0.7517, z=0.6419),
atomic species: oxygen, atomic coordinates (x=0.3596, y=0.9715, z=0.878),
atomic species: oxygen, atomic coordinates (x=0.3413, y=0.6644, z=0.7743),
atomic species: oxygen, atomic coordinates (x=0.2829, y=0.9698, z=0.6015),
atomic species: oxygen, atomic coordinates (x=0.2192, y=0.4904, z=0.8766),
atomic species: oxygen, atomic coordinates (x=0.1993, y=0.7535, z=0.9438), and
atomic species: oxygen, atomic coordinates (x=0.0356, y=0.9752, z=0.883).

According to a compound according to an exemplary form of the invention, a compound usable to prepare an oxide semiconductor material whose band gap is sufficiently large compared with a typical Si semiconductor can be provided.

DESCRIPTION OF EMBODIMENT(S)

Figure 1:
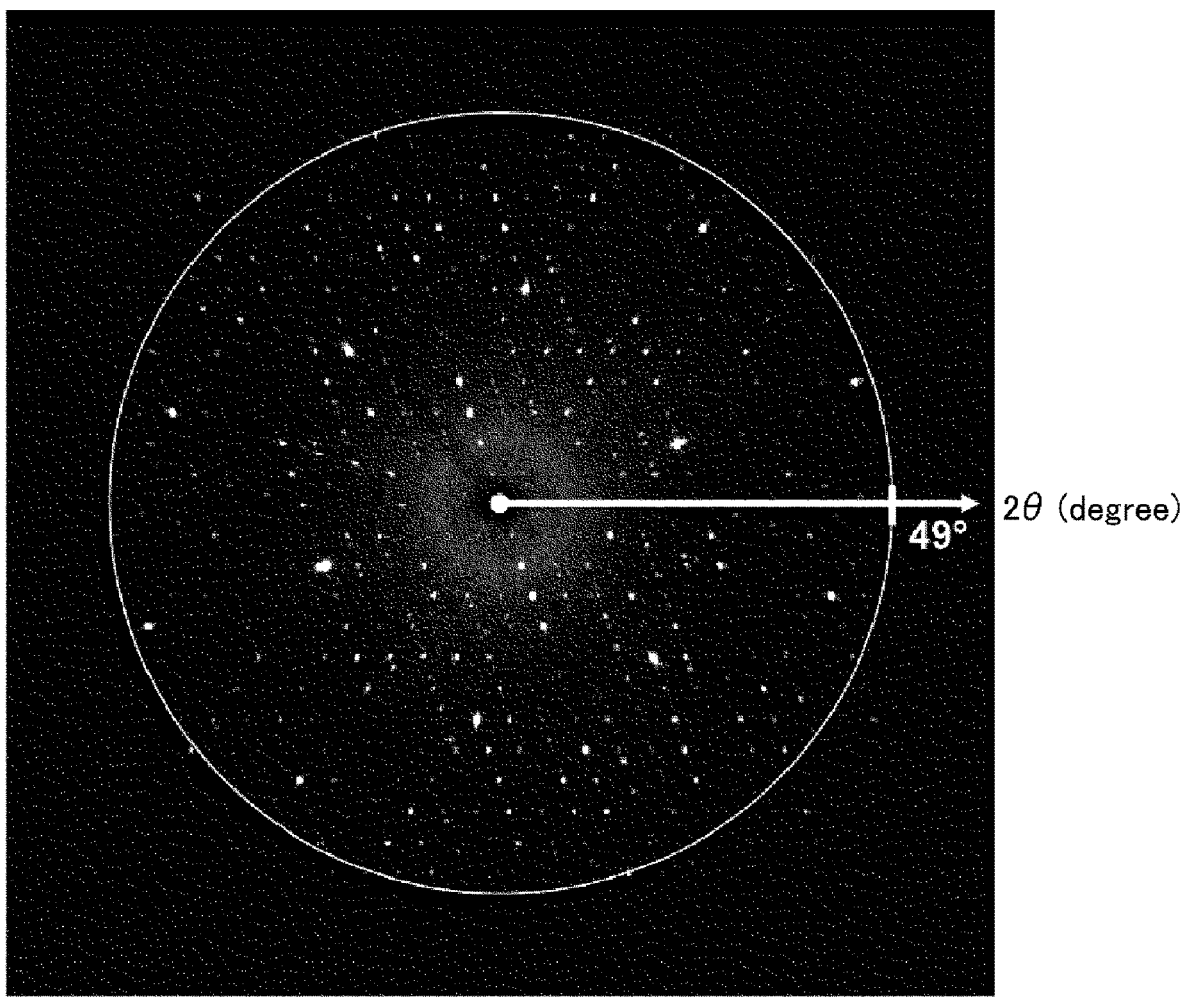
FIG. 1 is a precession photograph showing a (10.12, 0.00, 2.09) plane of a single crystal according to Example 2.

Herein, when a numerical range is represented by "a to b," a lower limit is the value (a) and an upper limit is the value (b).

Compound

A compound according to an exemplary embodiment (hereinafter, occasionally referred to as a compound A) contains indium element (In), gallium element (Ga), aluminum element (Al) and oxygen element (O).

Lattice constants of the compound A are
a=10.07±0.15 Å,
b=10.45±0.15 Å,
c=11.01±0.15 Å,
α=111.70±0.50°,
β=107.70±0.50° and
γ=90.00±0.50°.

The compound A has a triclinic crystal system.
In the compound A according to the exemplary embodiment, the lattice constants are preferably
a=10.07±0.13 Å,
b=10.45±0.13 Å,
c=11.01±0.13 Å,
α=111.70±0.40°,
β=107.70±0.40° and
γ=90.00±0.40°.

In the compound A according to the exemplary embodiment, the lattice constants are more preferably
a=10.07±0.10 Å,
b=10.45±0.10 Å,
c=11.01±0.10 Å,
α=111.70±0.30°,
β=107.70±0.30° and
γ=90.00±0.30°.

Herein, Å is a unit equal to $10^{-10}$ m.

A single crystal grain of the compound A is measured with a single crystal X-ray diffractometer for an XRD pattern thereof and the XRD pattern is subjected to crystal structure analysis with a single crystal X-ray structure analysis software. The obtained result is used to determine the lattice constants and atomic coordinates of the compound A.

Since the Joint Committee on Powder Diffraction Standard (JCPDS) and the Inorganic Crystal Structure Database (ICSD) do not have an identical powder XRD pattern to that of the prepared sample, it has been found that the compound A according to the exemplary embodiment is a compound with an unknown crystal structure.

Crystal Structure Analysis

Powders of gallium oxide, aluminum oxide and indium oxide are mixed and sintered to prepare a single crystal grain. The single crystal grain can be measured with a single crystal X-ray diffractometer, D8 QUEST (manufactured by Bruker Corporation), to identify a crystal structure of the compound A according to the exemplary embodiment. This measurement uses an X-ray source of MoKα, a wavelength of 0.71073 Å, a tube voltage of 50 kV, a tube current of 1 mA and a radiation diameter of 200 μm. The obtained XRD pattern can be analyzed with a single crystal X-ray structure analysis software, APEX3 (manufactured by Bruker Corporation), to identify the crystal structure. In this measurement, a size of the single crystal grain is preferably 30 μm or more to facilitate measurement.

In the compound A according to the exemplary embodiment, atomic ratios between indium element (In), gallium element (Ga) and aluminum element (Al) are preferably in ranges represented by formulae (1) to (3) below.

$$30 \leq In/(In+Ga+Al) \leq 62 \quad (1)$$

$$15 \leq Ga/(In+Ga+Al) \leq 45 \quad (2)$$

$$Al/(In+Ga+Al) \leq 35 \quad (3)$$

(In the formulae (1) to (3), In, Al and Ga represent the number of atoms of indium element, aluminum element and gallium element in the oxide sintered body, respectively.)

Measurement Method of Atomic Ratios

Atomic ratios described herein can be measured with Inductively Coupled Plasma-Atomic Emission Spectrometry (ICP-AES).

Crystal System and Space Group

The compound A according to the exemplary embodiment preferably has a triclinic crystal system and a crystal structure belonging to space group P-1. It should be noted that "-" between "P" and "1" in the space group "P-1" is formally placed above "1" (hereinafter, the same applies to notations of a space group).

First Exemplary Form of Compound A

A first exemplary form of the compound A according to the exemplary embodiment has space group P-1 and an atomic configuration below, in which at least one metal in the atomic configuration is any one of In, Ga and Al, or any two or more of In, Ga and Al, and is on the same atomic coordinates at a predetermined ratio, the atomic coordinates on which the at least one metal is arranged are in a range of $x \pm 0.01$,
$y \pm 0.01$, and
$z \pm 0.01$, and atomic coordinates on which oxygen is arranged are in a range of $x \pm 0.01$,
$y \pm 0.01$, and
$z \pm 0.01$, where atomic species: metal, atomic coordinates (x=0.04, y=0.36, z=0.87),
atomic species: metal, atomic coordinates (x=0.13, y=0.12, z=0.62),
atomic species: metal, atomic coordinates (x=0.21, y=0.85, z=0.39),
atomic species: metal, atomic coordinates (x=0.23, y=0.11, z=0.97),
atomic species: metal, atomic coordinates (x=0.29, y=0.64, z=0.11),
atomic species: metal, atomic coordinates (x=0.46, y=0.12, z=0.63),
atomic species: metal, atomic coordinates (x=0.58, y=0.14, z=0.01),
atomic species: metal, atomic coordinates (x=0.62, y=0.64, z=0.11),
atomic species: metal, atomic coordinates (x=0.69, y=0.18, z=0.32),
atomic species: metal, atomic coordinates (x=0.09, y=0.88, z=0.03),
atomic species: metal, atomic coordinates (x=0.02, y=0.13, z=0.30),
atomic species: metal, atomic coordinates (x=0.06, y=0.61, z=0.46),
atomic species: metal, atomic coordinates (x=0.15, y=0.40, z=0.19),
atomic species: metal, atomic coordinates (x=0.26, y=0.36, z=0.54),
atomic species: metal, atomic coordinates (x=0.34, y=0.13, z=0.30),
atomic species: metal, atomic coordinates (x=0.41, y=0.61, z=0.45),
atomic species: metal, atomic coordinates (x=0.48, y=0.40, z=0.23),
atomic species: metal, atomic coordinates (x=0.84, y=0.39, z=0.23),
atomic species: oxygen, atomic coordinates (x=0.02, y=0.73, z=0.36),
atomic species: oxygen, atomic coordinates (x=0.03, y=0.45, z=0.29),
atomic species: oxygen, atomic coordinates (x=0.05, y=0.02, z=0.40),
atomic species: oxygen, atomic coordinates (x=0.10, y=0.74, z=0.65),
atomic species: oxygen, atomic coordinates (x=0.10, y=0.23, z=0.06),
atomic species: oxygen, atomic coordinates (x=0.12, y=0.51, z=0.09),
atomic species: oxygen, atomic coordinates (x=0.12, y=0.47, z=0.57),
atomic species: oxygen, atomic coordinates (x=0.13, y=0.79, z=0.17),
atomic species: oxygen, atomic coordinates (x=0.19, y=0.21, z=0.84),
atomic species: oxygen, atomic coordinates (x=0.20, y=0.23, z=0.36),
atomic species: oxygen, atomic coordinates (x=0.25, y=0.66, z=0.49),
atomic species: oxygen, atomic coordinates (x=0.27, y=0.02, z=0.12),
atomic species: oxygen, atomic coordinates (x=0.30, y=0.26, z=0.65),
atomic species: oxygen, atomic coordinates (x=0.33, y=0.44, z=0.29),
atomic species: oxygen, atomic coordinates (x=0.38, y=0.02, z=0.40),
atomic species: oxygen, atomic coordinates (x=0.39, y=0.73, z=0.35),
atomic species: oxygen, atomic coordinates (x=0.41, y=0.24, z=0.07),
atomic species: oxygen, atomic coordinates (x=0.43, y=0.47, z=0.57),
atomic species: oxygen, atomic coordinates (x=0.46, y=0.51, z=0.11),
atomic species: oxygen, atomic coordinates (x=0.47, y=0.79, z=0.15),
atomic species: oxygen, atomic coordinates (x=0.50, y=0.25, z=0.36),
atomic species: oxygen, atomic coordinates (x=0.64, y=0.03, z=0.12),
atomic species: oxygen, atomic coordinates (x=0.66, y=0.34, z=0.23),
atomic species: oxygen, atomic coordinates (x=0.72, y=0.03, z=0.40),
atomic species: oxygen, atomic coordinates (x=0.78, y=0.51, z=0.12),
atomic species: oxygen, atomic coordinates (x=0.80, y=0.25, z=0.06), and
atomic species: oxygen, atomic coordinates (x=0.96, y=0.02, z=0.12).

The above is the atomic configuration of the first exemplary form of the compound A according to the exemplary embodiment.

Second Exemplary Form of Compound A

A second exemplary form of the compound A according to the exemplary embodiment has space group P-1 and an atomic configuration below, in which at least one metal in the atomic configuration is any one of In, Ga and Al, or any two or more of In, Ga and Al, and is on the same atomic coordinates at a predetermined ratio, the atomic coordinates on which the at least one metal is arranged are in a range of $x \pm 0.01$,
$y \pm 0.01$, and
$z \pm 0.01$, and atomic coordinates on which oxygen is arranged are in a range of $x \pm 0.01$,
$y \pm 0.01$, and
$z \pm 0.01$, where atomic species: metal, atomic coordinates (x=0.04478, y=0.36228, z=0.86934),
atomic species: metal, atomic coordinates (x=0.12677, y=0.11682, z=0.62279),
atomic species: metal, atomic coordinates (x=0.21268, y=0.8504, z=0.38665), atomic species: metal, atomic coordinates (x=0.23283, y=0.11047, z=0.97132),
atomic species: metal, atomic coordinates (x=0.28695, y=0.64349, z=0.10627),
atomic species: metal, atomic coordinates (x=0.45663, y=0.11849, z=0.62655),
atomic species: metal, atomic coordinates (x=0.58343, y=0.14455, z=0.0065),
atomic species: metal, atomic coordinates (x=0.62181, y=0.6417, z=0.10725),
atomic species: metal, atomic coordinates (x=0.68785, y=0.18413, z=0.31614),
atomic species: metal, atomic coordinates (x=0.08662, y=0.88097, z=0.03282),
atomic species: metal, atomic coordinates (x=0.02388, y=0.13328, z=0.30129),
atomic species: metal, atomic coordinates (x=0.0627, y=0.6051, z=0.4561),
atomic species: metal, atomic coordinates (x=0.1503, y=0.3962, z=0.1949),
atomic species: metal, atomic coordinates (x=0.2624, y=0.36429, z=0.5374),
atomic species: metal, atomic coordinates (x=0.34051, y=0.1304, z=0.29845),
atomic species: metal, atomic coordinates (x=0.4081, y=0.6082, z=0.4509),
atomic species: metal, atomic coordinates (x=0.4821, y=0.39651, z=0.22899),
atomic species: metal, atomic coordinates (x=0.8369, y=0.39245, z=0.23049),
atomic species: oxygen, atomic coordinates (x=0.0157, y=0.7332, z=0.3627),
atomic species: oxygen, atomic coordinates (x=0.0295, y=0.4499, z=0.285),
atomic species: oxygen, atomic coordinates (x=0.0518, y=0.0204, z=0.4013),
atomic species: oxygen, atomic coordinates (x=0.0975, y=0.7442, z=0.6484),
atomic species: oxygen, atomic coordinates (x=0.1004, y=0.231, z=0.0611),
atomic species: oxygen, atomic coordinates (x=0.121, y=0.5054, z=0.0929),
atomic species: oxygen, atomic coordinates (x=0.1218, y=0.4677, z=0.5675),
atomic species: oxygen, atomic coordinates (x=0.1323, y=0.7893, z=0.17),
atomic species: oxygen, atomic coordinates (x=0.1917, y=0.2052, z=0.837),
atomic species: oxygen, atomic coordinates (x=0.1998, y=0.2293, z=0.3578),
atomic species: oxygen, atomic coordinates (x=0.2461, y=0.6607, z=0.4873),
atomic species: oxygen, atomic coordinates (x=0.2703, y=0.0197, z=0.1161),
atomic species: oxygen, atomic coordinates (x=0.2975, y=0.2578, z=0.6451),
atomic species: oxygen, atomic coordinates (x=0.3274, y=0.4429, z=0.2908),
atomic species: oxygen, atomic coordinates (x=0.38, y=0.017, z=0.3996),
atomic species: oxygen, atomic coordinates (x=0.3852, y=0.7303, z=0.3495),
atomic species: oxygen, atomic coordinates (x=0.4077, y=0.2385, z=0.0657),
atomic species: oxygen, atomic coordinates (x=0.425, y=0.4654, z=0.5745),
atomic species: oxygen, atomic coordinates (x=0.4569, y=0.5063, z=0.1142),
atomic species: oxygen, atomic coordinates (x=0.472, y=0.7862, z=0.1502),
atomic species: oxygen, atomic coordinates (x=0.50, y=0.2483, z=0.3581),
atomic species: oxygen, atomic coordinates (x=0.6404, y=0.0285, z=0.122),
atomic species: oxygen, atomic coordinates (x=0.6587, y=0.3356, z=0.2257),
atomic species: oxygen, atomic coordinates (x=0.7171, y=0.0302, z=0.3985),
atomic species: oxygen, atomic coordinates (x=0.7808, y=0.5096, z=0.1234),
atomic species: oxygen, atomic coordinates (x=0.8007, y=0.2465, z=0.0562), and
atomic species: oxygen, atomic coordinates (x=0.9644, y=0.0248, z=0.117).

The above is the atomic configuration of the second exemplary form of the compound A according to the exemplary embodiment.

In addition, the compound A according to the exemplary embodiment preferably has a triclinic crystal system and a crystal structure belonging to space group P-1.

Third Exemplary Form of Compound A

A third exemplary form of the compound A according to the exemplary embodiment has space group P-1 and an atomic configuration below, in which at least one metal in the atomic configuration is any one of In, Ga and Al, or any two or more of In, Ga and Al, and is on the same atomic coordinates at a predetermined ratio, the atomic coordinates on which the at least one metal is arranged are in a range of x±0.01,
y±0.01, and
z±0.01, and atomic coordinates on which oxygen is arranged are in a range of x±0.01,
y±0.01, and
z±0.01, where atomic species: metal, atomic coordinates (x=0.04, y=0.36, z=0.87),
atomic species: metal, atomic coordinates (x=0.13, y=0.12, z=0.62),
atomic species: metal, atomic coordinates (x=0.21, y=0.85, z=0.39),
atomic species: metal, atomic coordinates (x=0.23, y=0.11, z=0.97),
atomic species: metal, atomic coordinates (x=0.29, y=0.64, z=0.11),
atomic species: metal, atomic coordinates (x=0.46, y=0.12, z=0.63),
atomic species: metal, atomic coordinates (x=0.58, y=0.14, z=0.01),
atomic species: metal, atomic coordinates (x=0.62, y=0.64, z=0.11),
atomic species: metal, atomic coordinates (x=0.69, y=0.18, z=0.32),
atomic species: metal, atomic coordinates (x=0.09, y=0.88, z=0.03),
atomic species: metal, atomic coordinates (x=0.02, y=0.13, z=0.30),
atomic species: metal, atomic coordinates (x=0.06, y=0.61, z=0.46),
atomic species: metal, atomic coordinates (x=0.15, y=0.40, z=0.19), atomic species: metal, atomic coordinates (x=0.26, y=0.36, z=0.54),
atomic species: metal, atomic coordinates (x=0.34, y=0.13, z=0.30),
atomic species: metal, atomic coordinates (x=0.41, y=0.61, z=0.45),
atomic species: metal, atomic coordinates (x=0.48, y=0.40, z=0.23),
atomic species: metal, atomic coordinates (x=0.84, y=0.39, z=0.23),
atomic species: metal, atomic coordinates (x=0.96, y=0.64, z=0.13),
atomic species: metal, atomic coordinates (x=0.87, y=0.88, z=0.38),
atomic species: metal, atomic coordinates (x=0.79, y=0.15, z=0.61),
atomic species: metal, atomic coordinates (x=0.77, y=0.89, z=0.03),
atomic species: metal, atomic coordinates (x=0.71, y=0.36, z=0.89),
atomic species: metal, atomic coordinates (x=0.54, y=0.88, z=0.37),
atomic species: metal, atomic coordinates (x=0.42, y=0.86, z=0.99),
atomic species: metal, atomic coordinates (x=0.38, y=0.36, z=0.89),
atomic species: metal, atomic coordinates (x=0.31, y=0.82, z=0.68),
atomic species: metal, atomic coordinates (x=0.91, y=0.12, z=0.97),
atomic species: metal, atomic coordinates (x=0.98, y=0.87, z=0.70),
atomic species: metal, atomic coordinates (x=0.94, y=0.39, z=0.54),
atomic species: metal, atomic coordinates (x=0.85, y=0.60, z=0.81),
atomic species: metal, atomic coordinates (x=0.74, y=0.64, z=0.46),
atomic species: metal, atomic coordinates (x=0.66, y=0.87, z=0.70),
atomic species: metal, atomic coordinates (x=0.59, y=0.39, z=0.55),
atomic species: metal, atomic coordinates (x=0.52, y=0.60, z=0.77),
atomic species: metal, atomic coordinates (x=0.16, y=0.61, z=0.77),
atomic species: oxygen, atomic coordinates (x=0.02, y=0.73, z=0.36),
atomic species: oxygen, atomic coordinates (x=0.03, y=0.45, z=0.29),
atomic species: oxygen, atomic coordinates (x=0.05, y=0.02, z=0.40),
atomic species: oxygen, atomic coordinates (x=0.10, y=0.74, z=0.65),
atomic species: oxygen, atomic coordinates (x=0.10, y=0.23, z=0.06),
atomic species: oxygen, atomic coordinates (x=0.12, y=0.51, z=0.09),
atomic species: oxygen, atomic coordinates (x=0.12, y=0.47, z=0.57),
atomic species: oxygen, atomic coordinates (x=0.13, y=0.79, z=0.17),
atomic species: oxygen, atomic coordinates (x=0.19, y=0.21, z=0.84),
atomic species: oxygen, atomic coordinates (x=0.20, y=0.23, z=0.36),
atomic species: oxygen, atomic coordinates (x=0.25, y=0.66, z=0.49),
atomic species: oxygen, atomic coordinates (x=0.27, y=0.02, z=0.12),
atomic species: oxygen, atomic coordinates (x=0.30, y=0.26, z=0.65),
atomic species: oxygen, atomic coordinates (x=0.33, y=0.44, z=0.29),
atomic species: oxygen, atomic coordinates (x=0.38, y=0.02, z=0.40),
atomic species: oxygen, atomic coordinates (x=0.39, y=0.73, z=0.35),
atomic species: oxygen, atomic coordinates (x=0.41, y=0.24, z=0.07),
atomic species: oxygen, atomic coordinates (x=0.43, y=0.47, z=0.57),
atomic species: oxygen, atomic coordinates (x=0.46, y=0.51, z=0.11),
atomic species: oxygen, atomic coordinates (x=0.47, y=0.79, z=0.15),
atomic species: oxygen, atomic coordinates (x=0.50, y=0.25, z=0.36),
atomic species: oxygen, atomic coordinates (x=0.64, y=0.03, z=0.12),
atomic species: oxygen, atomic coordinates (x=0.66, y=0.34, z=0.23),
atomic species: oxygen, atomic coordinates (x=0.72, y=0.03, z=0.40),
atomic species: oxygen, atomic coordinates (x=0.78, y=0.51, z=0.12),
atomic species: oxygen, atomic coordinates (x=0.80, y=0.25, z=0.06),
atomic species: oxygen, atomic coordinates (x=0.96, y=0.02, z=0.12),
atomic species: oxygen, atomic coordinates (x=0.98, y=0.27, z=0.64),
atomic species: oxygen, atomic coordinates (x=0.97, y=0.55, z=0.72),
atomic species: oxygen, atomic coordinates (x=0.95, y=0.98, z=0.60),
atomic species: oxygen, atomic coordinates (x=0.90, y=0.26, z=0.35),
atomic species: oxygen, atomic coordinates (x=0.90, y=0.77, z=0.94),
atomic species: oxygen, atomic coordinates (x=0.88, y=0.49, z=0.91),
atomic species: oxygen, atomic coordinates (x=0.88, y=0.53, z=0.43),
atomic species: oxygen, atomic coordinates (x=0.87, y=0.21, z=0.83),
atomic species: oxygen, atomic coordinates (x=0.81, y=0.79, z=0.16),
atomic species: oxygen, atomic coordinates (x=0.80, y=0.77, z=0.64),
atomic species: oxygen, atomic coordinates (x=0.75, y=0.34, z=0.51),
atomic species: oxygen, atomic coordinates (x=0.73, y=0.98, z=0.88),
atomic species: oxygen, atomic coordinates (x=0.70, y=0.74, z=0.35),
atomic species: oxygen, atomic coordinates (x=0.67, y=0.56, z=0.71),
atomic species: oxygen, atomic coordinates (x=0.62, y=0.98, z=0.60),
atomic species: oxygen, atomic coordinates (x=0.61, y=0.27, z=0.65), atomic species: oxygen, atomic coordinates (x=0.59, y=0.76, z=0.93),
atomic species: oxygen, atomic coordinates (x=0.58, y=0.53, z=0.43),
atomic species: oxygen, atomic coordinates (x=0.54, y=0.49, z=0.89),
atomic species: oxygen, atomic coordinates (x=0.53, y=0.21, z=0.85),
atomic species: oxygen, atomic coordinates (x=0.50, y=0.75, z=0.64),
atomic species: oxygen, atomic coordinates (x=0.36, y=0.97, z=0.88),
atomic species: oxygen, atomic coordinates (x=0.34, y=0.66, z=0.77),
atomic species: oxygen, atomic coordinates (x=0.28, y=0.97, z=0.60),
atomic species: oxygen, atomic coordinates (x=0.22, y=0.49, z=0.88),
atomic species: oxygen, atomic coordinates (x=0.20, y=0.75, z=0.94), and
atomic species: oxygen, atomic coordinates (x=0.04, y=0.98, z=0.88).

The above is the atomic configuration of the third exemplary form of the compound A according to the exemplary embodiment.

Fourth Exemplary Form of Compound A

A fourth exemplary form of the compound A according to the exemplary embodiment has space group P1 and an atomic configuration below, in which at least one metal in the atomic configuration is any one of In, Ga and Al, or any two or more of In, Ga and Al, and is on the same atomic coordinates at a predetermined ratio, the atomic coordinates on which the at least one metal is arranged are in a range of
x±0.01,
y±0.01, and
z±0.01, and atomic coordinates on which oxygen is arranged are in a range of
x±0.01,
y±0.01, and
z±0.01, where atomic species: metal, atomic coordinates (x=0.04478, y=0.36228, z=0.86934),
atomic species: metal, atomic coordinates (x=0.12677, y=0.11682, z=0.62279),
atomic species: metal, atomic coordinates (x=0.21268, y=0.8504, z=0.38665),
atomic species: metal, atomic coordinates (x=0.23283, y=0.11047, z=0.97132),
atomic species: metal, atomic coordinates (x=0.28695, y=0.64349, z=0.10627),
atomic species: metal, atomic coordinates (x=0.45663, y=0.11849, z=0.62655),
atomic species: metal, atomic coordinates (x=0.58343, y=0.14455, z=0.0065),
atomic species: metal, atomic coordinates (x=0.62181, y=0.6417, z=0.10725),
atomic species: metal, atomic coordinates (x=0.68785, y=0.18413, z=0.31614),
atomic species: metal, atomic coordinates (x=0.08662, y=0.88097, z=0.03282),
atomic species: metal, atomic coordinates (x=0.02388, y=0.13328, z=0.30129),
atomic species: metal, atomic coordinates (x=0.0627, y=0.6051, z=0.4561),
atomic species: metal, atomic coordinates (x=0.1503, y=0.3962, z=0.1949),
atomic species: metal, atomic coordinates (x=0.2624, y=0.36429, z=0.5374),
atomic species: metal, atomic coordinates (x=0.34051, y=0.1304, z=0.29845),
atomic species: metal, atomic coordinates (x=0.4081, y=0.6082, z=0.4509),
atomic species: metal, atomic coordinates (x=0.4821, y=0.39651, z=0.22899),
atomic species: metal, atomic coordinates (x=0.8369, y=0.39245, z=0.23049),
atomic species: metal, atomic coordinates (x=0.95522, y=0.63772, z=0.13066),
atomic species: metal, atomic coordinates (x=0.87323, y=0.88318, z=0.37721),
atomic species: metal, atomic coordinates (x=0.78732, y=0.1496, z=0.61335),
atomic species: metal, atomic coordinates (x=0.76717, y=0.88953, z=0.02868),
atomic species: metal, atomic coordinates (x=0.71305, y=0.35651, z=0.89373),
atomic species: metal, atomic coordinates (x=0.54337, y=0.88151, z=0.37345),
atomic species: metal, atomic coordinates (x=0.41657, y=0.85545, z=0.9935),
atomic species: metal, atomic coordinates (x=0.37819, y=0.3583, z=0.89275),
atomic species: metal, atomic coordinates (x=0.31215, y=0.81587, z=0.68386),
atomic species: metal, atomic coordinates (x=0.91338, y=0.11903, z=0.96718),
atomic species: metal, atomic coordinates (x=0.97612, y=0.86672, z=0.69871),
atomic species: metal, atomic coordinates (x=0.9373, y=0.3949, z=0.5439),
atomic species: metal, atomic coordinates (x=0.8497, y=0.6038, z=0.8051),
atomic species: metal, atomic coordinates (x=0.7376, y=0.63571, z=0.4626),
atomic species: metal, atomic coordinates (x=0.65949, y=0.8696, z=0.70155),
atomic species: metal, atomic coordinates (x=0.5919, y=0.3918, z=0.5491),
atomic species: metal, atomic coordinates (x=0.5179, y=0.60349, z=0.77101),
atomic species: metal, atomic coordinates (x=0.1631, y=0.60755, z=0.76951),
atomic species: oxygen, atomic coordinates (x=0.0157, y=0.7332, z=0.3627),
atomic species: oxygen, atomic coordinates (x=0.0295, y=0.4499, z=0.285),
atomic species: oxygen, atomic coordinates (x=0.0518, y=0.0204, z=0.4013),
atomic species: oxygen, atomic coordinates (x=0.0975, y=0.7442, z=0.6484),
atomic species: oxygen, atomic coordinates (x=0.1004, y=0.231, z=0.0611),
atomic species: oxygen, atomic coordinates (x=0.121, y=0.5054, z=0.0929),
atomic species: oxygen, atomic coordinates (x=0.1218, y=0.4677, z=0.5675),
atomic species: oxygen, atomic coordinates (x=0.1323, y=0.7893, z=0.17),
atomic species: oxygen, atomic coordinates (x=0.1917, y=0.2052, z=0.837), atomic species: oxygen, atomic coordinates (x=0.1998, y=0.2293, z=0.3578),
atomic species: oxygen, atomic coordinates (x=0.2461, y=0.6607, z=0.4873),
atomic species: oxygen, atomic coordinates (x=0.2703, y=0.0197, z=0.1161),
atomic species: oxygen, atomic coordinates (x=0.2975, y=0.2578, z=0.6451),
atomic species: oxygen, atomic coordinates (x=0.3274, y=0.4429, z=0.2908),
atomic species: oxygen, atomic coordinates (x=0.38, y=0.017, z=0.3996),
atomic species: oxygen, atomic coordinates (x=0.3852, y=0.7303, z=0.3495),
atomic species: oxygen, atomic coordinates (x=0.4077, y=0.2385, z=0.0657),
atomic species: oxygen, atomic coordinates (x=0.425, y=0.4654, z=0.5745),
atomic species: oxygen, atomic coordinates (x=0.4569, y=0.5063, z=0.1142),
atomic species: oxygen, atomic coordinates (x=0.472, y=0.7862, z=0.1502),
atomic species: oxygen, atomic coordinates (x=0.50, y=0.2483, z=0.3581),
atomic species: oxygen, atomic coordinates (x=0.6404, y=0.0285, z=0.122),
atomic species: oxygen, atomic coordinates (x=0.6587, y=0.3356, z=0.2257),
atomic species: oxygen, atomic coordinates (x=0.7171, y=0.0302, z=0.3985),
atomic species: oxygen, atomic coordinates (x=0.7808, y=0.5096, z=0.1234),
atomic species: oxygen, atomic coordinates (x=0.8007, y=0.2465, z=0.0562),
atomic species: oxygen, atomic coordinates (x=0.9644, y=0.0248, z=0.117),
atomic species: oxygen, atomic coordinates (x=0.9843, y=0.2668, z=0.6373),
atomic species: oxygen, atomic coordinates (x=0.9705, y=0.5501, z=0.715),
atomic species: oxygen, atomic coordinates (x=0.9482, y=0.9796, z=0.5987),
atomic species: oxygen, atomic coordinates (x=0.9025, y=0.2558, z=0.3516),
atomic species: oxygen, atomic coordinates (x=0.8996, y=0.769, z=0.9389),
atomic species: oxygen, atomic coordinates (x=0.879, y=0.4946, z=0.9071),
atomic species: oxygen, atomic coordinates (x=0.8782, y=0.5323, z=0.4325),
atomic species: oxygen, atomic coordinates (x=0.8677, y=0.2107, z=0.83),
atomic species: oxygen, atomic coordinates (x=0.8083, y=0.7948, z=0.163),
atomic species: oxygen, atomic coordinates (x=0.8002, y=0.7707, z=0.6422),
atomic species: oxygen, atomic coordinates (x=0.7539, y=0.3393, z=0.5127),
atomic species: oxygen, atomic coordinates (x=0.7297, y=0.9803, z=0.8839),
atomic species: oxygen, atomic coordinates (x=0.7025, y=0.7422, z=0.3549),
atomic species: oxygen, atomic coordinates (x=0.6726, y=0.5571, z=0.7092),
atomic species: oxygen, atomic coordinates (x=0.62, y=0.983, z=0.6004),
atomic species: oxygen, atomic coordinates (x=0.6148, y=0.2697, z=0.6505),
atomic species: oxygen, atomic coordinates (x=0.5923, y=0.7615, z=0.9343),
atomic species: oxygen, atomic coordinates (x=0.575, y=0.5346, z=0.4255),
atomic species: oxygen, atomic coordinates (x=0.5431, y=0.4937, z=0.8858),
atomic species: oxygen, atomic coordinates (x=0.528, y=0.2138, z=0.8498),
atomic species: oxygen, atomic coordinates (x=0.5, y=0.7517, z=0.6419),
atomic species: oxygen, atomic coordinates (x=0.3596, y=0.9715, z=0.878),
atomic species: oxygen, atomic coordinates (x=0.3413, y=0.6644, z=0.7743),
atomic species: oxygen, atomic coordinates (x=0.2829, y=0.9698, z=0.6015),
atomic species: oxygen, atomic coordinates (x=0.2192, y=0.4904, z=0.8766),
atomic species: oxygen, atomic coordinates (x=0.1993, y=0.7535, z=0.9438), and
atomic species: oxygen, atomic coordinates (x=0.0356, y=0.9752, z=0.883).

The above is the atomic configuration of the fourth exemplary form of the compound A according to the exemplary embodiment.

Band Gap

The band gap of the compound A is preferably in a range from 1.1 eV to 4.8 eV, more preferably in a range from 1.5 eV to 4.5 eV, further preferably in a range from 2.0 eV to 4.0 eV, still more preferably in a range from 3.0 eV to 3.7 eV. The band gap of the compound A is also preferably in a range from 2.9 eV to 3.3 eV.

The compound A has a band gap larger than that of a single crystal silicon, and thus is excellent as a material for a power semiconductor. In addition, the compound A has a band gap smaller than that of β-gallia (β-$Ga_2O_3$), and thus is more useful than β-gallia (β-$Ga_2O_3$) in terms of thermal conductivity and a bulk resistivity value. Further, the compound A provides a more excellent balance of properties than β-gallia (β-$Ga_2O_3$), and thus is highly expected as a next generation material.

A measurement method of a band gap is as follows. A sintered body sample is measured for a diffuse reflection spectrum, from which a spectrum with a wavelength in an abscissa axis being converted into energy (unit: eV) is obtained. In the spectrum, a region where reflectivity sharply declines is approximated by a straight line (first straight line), and a straight line parallel to the energy axis and passing a point of maximum reflectivity in the same spectrum is defined as a second straight line. From an intersection point of the first straight line and the second straight line, a band gap is calculated. The diffuse reflection spectrum can be measured with a spectrophotometer V-670 (manufactured by JASCO Corporation) equipped with an integrating sphere unit ISN-723 (manufactured by JASCO Corporation).

The compound A according to the exemplary embodiment has a large band gap, which allows conductivity thereof to be improved. The use of the compound A according to the exemplary embodiment makes it possible to prepare an oxide semiconductor material whose band gap is sufficiently large compared with a typical Si semiconductor.

Production Method of Compound A

The compound A according to the exemplary embodiment can be produced with a solid phase reaction method, a gas phase reaction method, a melt-growth method, a solution method, a sol-gel method, a sputtering method, TEOS-CVD, mist CVD, an ion plating method, a vacuum deposition method or an electron beam deposition method, but the production method thereof is not limited thereto.

The compound A, which contains indium element (In), gallium element (Ga) and aluminum element (Al), is obtained by sintering, for instance, indium oxide, gallium oxide and aluminum oxide.

For instance, a single crystal grain of the compound A can be extracted from a polycrystalline sintered body obtained by sintering these oxides at 1500 degrees C.

Sintered Body

A sintered body according to the exemplary embodiment is a sintered body containing the compound A according to the exemplary embodiment, and preferably a sintered body consisting of the compound A according to the exemplary embodiment.

The prepared sintered body (single crystal grain) can be measured with a single crystal X-ray diffractometer, D8 QUEST (manufactured by Bruker Corporation) and the obtained XRD pattern is analyzed with APEX3 (manufactured by Bruker Corporation) to calculate lattice constants thereof.

Bulk Resistivity

The bulk resistivity of the compound A according to the exemplary embodiment is preferably in a range from 0.1 mΩ·cm to 500 mΩ·cm, more preferably in a range from 0.1 mΩ·cm to 100 mΩ·cm, further preferably in a range from 0.5 mΩ·cm to 50 mΩ·cm, still more preferably in a range from 1 mΩ·cm to 30 mΩ·cm.

The compound A according to the exemplary embodiment having a bulk resistivity of 500 mΩ·cm or less is a compound with a sufficiently low resistivity and has a conductivity suitable as a semiconductor. In a case of a bulk resistivity of 0.1 mΩ·cm or more, the compound A according to the exemplary embodiment is more suitable as a semiconductor material.

The bulk resistivity is measurable according to the method described in Examples.

Usage of Compound A

In use of the compound A according to the exemplary embodiment as a material for a device, the compound A may be used in a form of a sintered body, a substrate, a thin film, a microparticle, or a precursor generated prior to preparing these devices, but the form thereof is not limited thereto.

Examples of application of the compound A according to the exemplary embodiment as a sintered body include a sputtering target, a resistor, a varistor, a monolithic ceramic capacitor, a slot die, a monolithic ferrite chip inductor, a chip varistor, a thermistor and a piezoelectric actuator.

Examples of application of the compound A according to the exemplary embodiment as a substrate or a thin film include a field-effect transistor, a logic circuit, a memory circuit, a differential amplifier, a power semiconductor device, a rectifier diode element, a Schottky barrier diode device, a junction transistor device, an electrostatic discharge (ESD) protection diode, a transient voltage suppressor (TVS) diode, a light-emitting diode, a metal-semiconductor field-effect transistor (MESFET), a junction gate field-effect transistor (JFET), a metal-oxide-semiconductor field-effect transistor (MOSFET), a Schottky source/drain MOSFET, an avalanche multiplication photoelectric conversion element, a solid-state image sensor, a solar cell element, a photosensor, a display element and a resistive random access memory.

An electronic circuit in a device having a substrate or a thin film formed of the compound A according to the above-described exemplary embodiment can be used as an electric device, an electronic device, a vehicle, a power engine or the like.

EXAMPLES

An aspect(s) of the invention will be described below with reference to Examples and a Comparative. It should however be noted that the scope of the invention is not limited to Examples.

Production Method of Single Crystal Used for Crystal Structure Analysis

Examples 1, 2, 3 and 4

70 g in total of powders of gallium oxide, aluminum oxide and indium oxide were weighed in metal composition ratios (at %) shown in Table 1. The weighed powders were put in an agate pot, to which 150 g of 2-mm-diameter zirconia balls working as agitators, 150 g of 5-mm-diameter zirconia balls also working as agitators, 0.35 g of polyvinyl alcohol (PVA) working as a binder and 56 g of purified water were added. The powders in the agate pot were mixed/pulverized with a planetary ball mill for six hours. Subsequently, the powders were put into a furnace of 120 degrees C. to be dried and only a mixture powder was screened with a 600-μm-mesh-sieve.

8 g of the mixture powder was put in a 1-inch-diameter die and pressed at a pressure of 20 kPa/cm$^2$ to prepare a press molding body.

After the densified press molding body was put in a platinum crucible and placed in an atmospheric-pressure sintering furnace, the temperature inside the furnace was raised at an increase rate of 5 degrees C./min to 800 degrees C. and the the press molding body was kept at 800 degrees C. for one hour. The temperature was then raised at an increase rate of 5 degrees C./min to 1350 degrees C. and the press molding body was sintered for 24 hours, left and cooled to a room temperature to obtain a polycrystalline sintered body. After the temperature was raised again at an increase rate of 5 degrees C./min to 1575 degrees C., the polycrystalline sintered body was sintered for two hours, then left and cooled to prepare a single crystal.

The obtained polycrystalline sintered body and the single crystal grain taken from the sinsterd body were evaluated as follows.

Comparative 1

A silicon wafer with the following specifications was evaluated:
substrate thickness: 650 μm;
specific electrical resistance: 8.70 cm;
conductivity: p-type;
crystal orientation: <100>.

Evaluation

Examples 1, 2, 3 and 4 and Comparative 1 were evaluated as follows and the evaluation results are shown in Table 1. A silicon wafer according to Comparative 1 was also evaluated.

(1) Lattice Constants and Atomic Coordinates

The XRD patterns of single crystal grains prepared according to Examples 1, 2, 3 and 4 were measured with a single crystal X-ray diffractometer, D8 QUEST (manufactured by Bruker Corporation). The measurement conditions of the XRD patterns were: an X-ray source of MoKα; a wavelength of 0.71073 Å; an X-ray tube voltage of 50 kV;

an X-ray tube current of 1 mA; and a radiation diameter of 200 μm. The obtained XRD patterns were analyzed with a single crystal X-ray structure analysis software, APEX3 (manufactured by Bruker Corporation), to obtain lattice constants, crystal systems, space groups, atomic ratios and atomic coordinates thereof. It should be noted that the size of the prepared single crystal grains was 30 μm or more.

(2) Bulk Resistivity (mΩ·cm)

The surface of the polycrystalline sintered bodies was polished and a surface obtained by exposing the inner surface of the sintered bodies was measured to identify bulk resistivity of the obtained compounds. The bulk resistivity (unit: mΩ·cm) was measured in accordance with a four-probe method (JIS K 7194: 1994) using a resistivity meter Loresta (manufactured by Mitsubishi Chemical Corporation).

Five points (the center of the surface exposed after polishing the sintered bodies, and four middle points between the center and four corners of the surface exposed after polishing the sintered bodies) were measured and averaged to be defined as the value of bulk resistivity.

(3) Band Gap of Polycrystalline Sintered Body

A polycrystalline sintered body sample was measured for a diffuse reflection spectrum, from which a spectrum with a wavelength in an abscissa axis being converted into energy (unit: eV) was obtained. In the spectrum, a region where reflectivity sharply declines was approximated by a straight line (first straight line), and a straight line parallel to the energy axis and passing a point of maximum reflectivity in the same spectrum was defined as a second straight line. From an intersection point of the first straight line and the second straight line, a band gap was calculated. The diffuse reflection spectrum was measured with a spectrophotometer V-670 (manufactured by JASCO Corporation) equipped with an integrating sphere unit ISN-723 (manufactured by JASCO Corporation).

(4) Atomic Ratio(s) of Single Crystal Grain

The sintered body was measured with a single crystal X-ray diffractometer, D8 QUEST (manufactured by Bruker Corporation) to identify an XRD pattern and the obtained XRD pattern was analyzed with a single crystal X-ray structure analysis software, APEX3 (manufactured by Bruker Corporation) to obtain an atomic ratio (metal composition ratio) of a single crystal grain. It was found that the single crystal grains according to Examples 1 to 4 have metal composition ratios (unit: at %) shown in Table 1.

A silicon wafer according to Comparative 1 was also measured for bulk resistivity and a band gap in a similar method to the method described in "(2) Bulk Resistivity" and "(3) Band Gap of Polycrystalline Sintered Body" above.

Evaluation Results

Example 2

FIG. 1 shows a precession photograph of a (10.12, 0.00, 2.09) plane of a single crystal according to Example 2.

Figure 2:
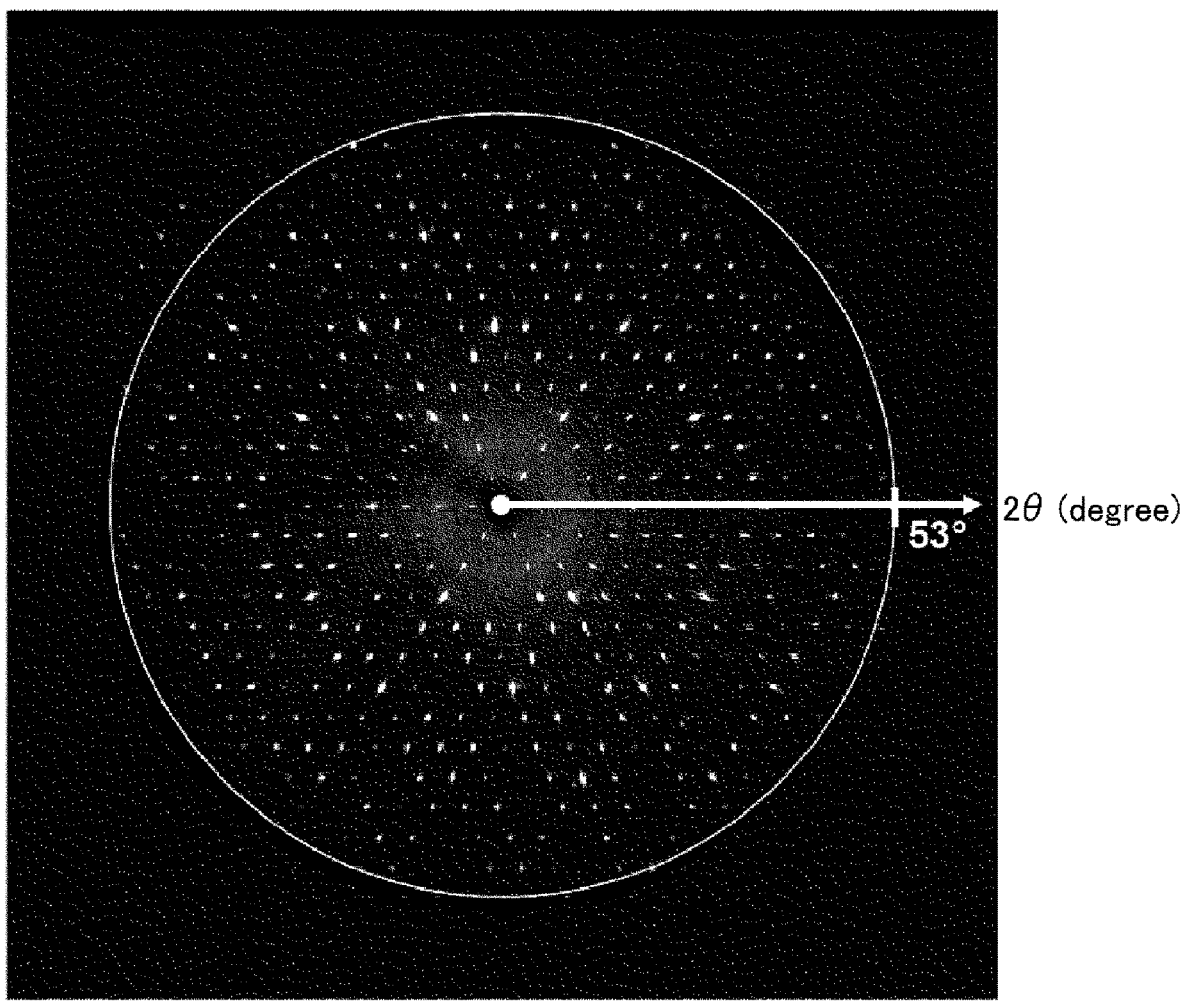
FIG. 2 is a precession photograph showing a (0.00, 12.78, −6.61) plane of the single crystal according to Example 2.

FIG. 2 shows a precession photograph of a (0.00, 12.78, −6.61) plane of the single crystal according to Example 2.

Figure 3:
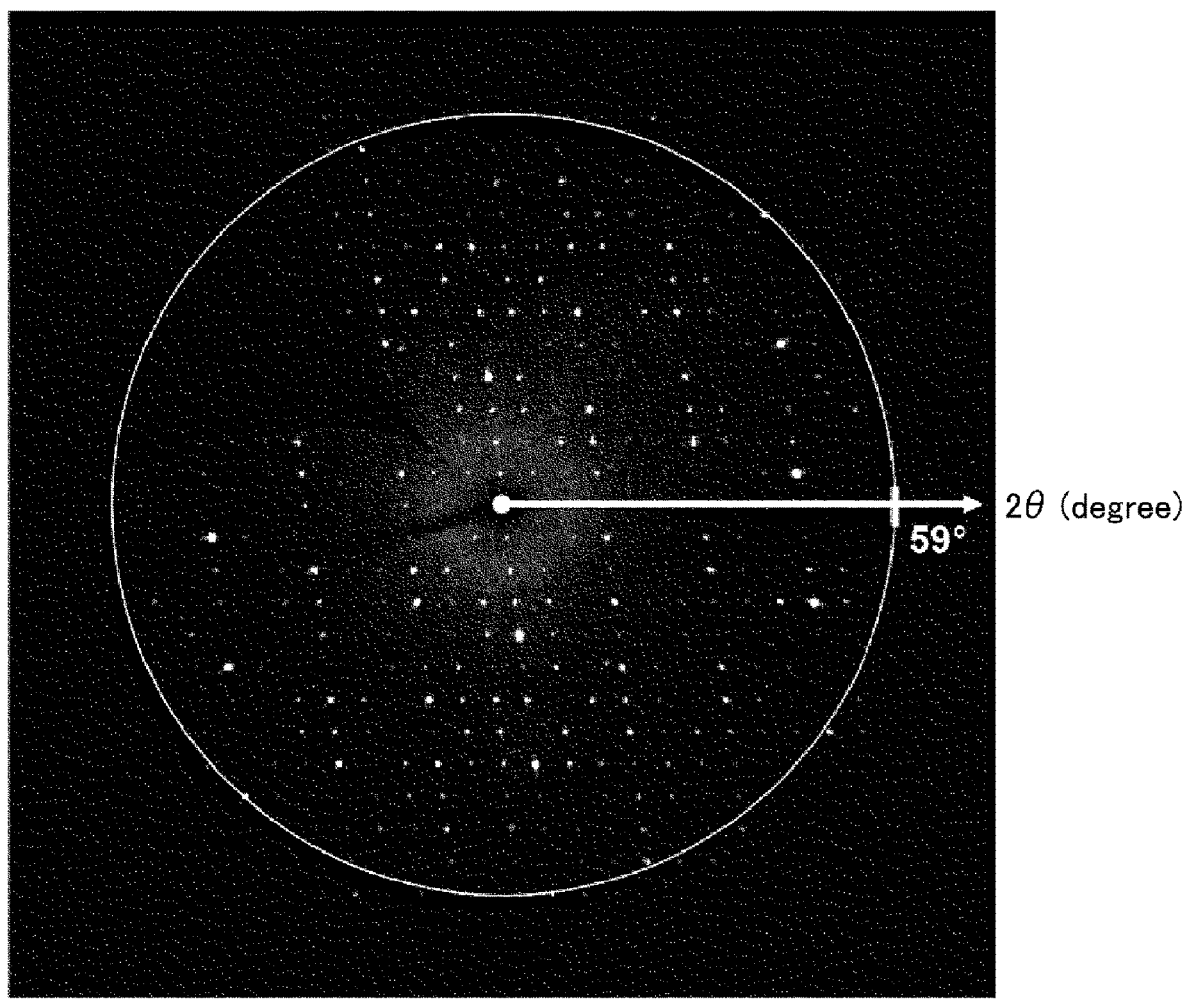
FIG. 3 is a precession photograph showing a (11.95, −7.08, 0.00) plane of the single crystal according to Example 2.

FIG. 3 shows a precession photograph of a (11.95, −7.08, 0.00) plane of the single crystal according to Example 2.

The precession photographs correspond to XRD patterns obtained by measuring the prepared sintered bodies (single crystal grains) with a single crystal X-ray diffractometer, D8 QUEST (manufactured by Bruker Corporation) as described in "(1) Lattice Constants and Atomic Coordinates" above.

Table 1 shows property evaluation results of sintered bodies according to Examples 1 to 4 and Comparative 1. It should be noted that the crystal system, space group and lattice constants shown in Table 1 are results obtained by the method described in "(1) Lattice Constants and Atomic Coordinates" above.

TABLE 1

|  |  | Example 1 | Example 2 | Example 3 | Example 4 | Comparative 1 |
|---|---|---|---|---|---|---|
| Abbreviation |  | IGAO | IGAO | IGAO | IGAO | Si |
| Composition | $In_2O_3$ | 53.8 | 63.9 | 67.1 | 61.9 | — |
| (mass %) | $Ga_2O_3$ | 36.3 | 27.6 | 18.1 | 33.5 | — |
|  | $Al_2O_3$ | 9.9 | 8.5 | 14.8 | 4.6 | — |
| Composition | In | 40.0 | 50.0 | 50.0 | 50.0 | — |
| (at %) | Ga | 40.0 | 30.0 | 20.0 | 40.0 | — |
|  | Al | 20.0 | 20.0 | 30.0 | 10.0 | — |
| Crystal System |  | — | triclinic | triclinic | triclinic | triclinic | — |
| Space Group |  | — | 2:P-1 | 2:P-1 | 2:P-1 | 2:P-1 | — |
| Lattice Constants | a (Å) | 10.06 | 10.04 | 10.04 | 10.12 | — |
|  | b (Å) | 10.39 | 10.37 | 10.37 | 10.51 | — |
|  | c (Å) | 10.96 | 10.92 | 10.93 | 11.06 | — |
|  | α (deg) | 111.31 | 111.32 | 111.29 | 111.65 | — |
|  | β (deg) | 107.70 | 107.69 | 107.66 | 107.58 | — |
|  | γ (deg) | 89.95 | 90.02 | 90.04 | 90.05 | — |
| Bulk Resistivity | mΩ·cm | 28.5 | 17.4 | 10.1 | 22.2 | $8.7 \times 10^3$ |
| Band Gap | eV | 3.23 | 3.13 | 3.13 | 3.01 | 1.11 |

Tables 2 and 3 show atomic coordinates of the compound A contained in the oxide sintered body according to Example 2. Table 4 shows the values of atomic coordinates shown in Table 2 in two decimal places. Table 5 shows the values of atomic coordinates shown in Table 3 in two decimal places.

TABLE 2

| Coordinate Name ID | Atomic Species S.F. | Site | Occupancy Ratio | x | y | z |
|---|---|---|---|---|---|---|
| In1 | In | 2 | 1 | 0.04478 | 0.36228 | 0.86934 |
| In2 | In | 2 | 1 | 0.12677 | 0.11682 | 0.62279 |
| In3 | In | 2 | 1 | 0.21268 | 0.8504 | 0.38665 |
| In4 | In | 2 | 0.593 | 0.23283 | 0.11047 | 0.97132 |
| Ga4 | Ga | 2 | 0.403 | 0.23283 | 0.11047 | 0.97132 |
| In5 | In | 2 | 1 | 0.28695 | 0.64349 | 0.10627 |
| In6 | In | 2 | 1 | 0.45663 | 0.11849 | 0.62655 |
| In7 | In | 2 | 1 | 0.58343 | 0.14455 | 0.0065 |
| In8 | In | 2 | 1 | 0.62181 | 0.6417 | 0.10725 |
| In9 | In | 2 | 1 | 0.68785 | 0.18413 | 0.31614 |
| In10 | In | 2 | 0.407 | 0.08662 | 0.88097 | 0.03282 |
| Ga10 | Ga | 2 | 0.589 | 0.08662 | 0.88097 | 0.03282 |
| Ga01 | Ga | 2 | 0.771 | 0.02388 | 0.13328 | 0.30129 |
| Al01 | Al | 2 | 0.229 | 0.02388 | 0.13328 | 0.30129 |
| Ga02 | Ga | 2 | 0.35 | 0.0627 | 0.6051 | 0.4561 |
| Al02 | Al | 2 | 0.65 | 0.0627 | 0.6051 | 0.4561 |
| Ga03 | Ga | 2 | 0.278 | 0.1503 | 0.3962 | 0.1949 |
| Al03 | Al | 2 | 0.722 | 0.1503 | 0.3962 | 0.1949 |
| Ga04 | Ga | 2 | 0.757 | 0.2624 | 0.36429 | 0.5374 |
| Al04 | Al | 2 | 0.243 | 0.2624 | 0.36429 | 0.5374 |
| Ga05 | Ga | 2 | 0.788 | 0.34051 | 0.1304 | 0.29845 |
| Al05 | Al | 2 | 0.212 | 0.34051 | 0.1304 | 0.29845 |
| Ga06 | Ga | 2 | 0.41 | 0.4081 | 0.6082 | 0.4509 |
| Al06 | Al | 2 | 0.59 | 0.4081 | 0.6082 | 0.4509 |
| Ga07 | Ga | 2 | 0.546 | 0.4821 | 0.39651 | 0.22899 |
| Al07 | Al | 2 | 0.454 | 0.4821 | 0.39651 | 0.22899 |
| Ga08 | Ga | 2 | 0.507 | 0.8369 | 0.39245 | 0.23049 |
| Al08 | Al | 2 | 0.493 | 0.8369 | 0.39245 | 0.23049 |

TABLE 3

| Coordinate Name ID | Atomic Species S.F. | Site | Occupancy Ratio | x | y | z |
|---|---|---|---|---|---|---|
| O1 | O | 2 | 1 | 0.0157 | 0.7332 | 0.3627 |
| O2 | O | 2 | 1 | 0.0295 | 0.4499 | 0.285 |
| O3 | O | 2 | 1 | 0.0518 | 0.0204 | 0.4013 |
| O4 | O | 2 | 1 | 0.0975 | 0.7442 | 0.6484 |
| O5 | O | 2 | 1 | 0.1004 | 0.231 | 0.0611 |
| O6 | O | 2 | 1 | 0.121 | 0.5054 | 0.0929 |
| O7 | O | 2 | 1 | 0.1218 | 0.4677 | 0.5675 |
| O8 | O | 2 | 1 | 0.1323 | 0.7893 | 0.17 |
| O9 | O | 2 | 1 | 0.1917 | 0.2052 | 0.837 |
| O10 | O | 2 | 1 | 0.1998 | 0.2293 | 0.3578 |
| O11 | O | 2 | 1 | 0.2461 | 0.6607 | 0.4873 |
| O12 | O | 2 | 1 | 0.2703 | 0.0197 | 0.1161 |
| O13 | O | 2 | 1 | 0.2975 | 0.2578 | 0.6451 |
| O14 | O | 2 | 1 | 0.3274 | 0.4429 | 0.2908 |
| O15 | O | 2 | 1 | 0.38 | 0.017 | 0.3996 |
| O16 | O | 2 | 1 | 0.3852 | 0.7303 | 0.3495 |
| O17 | O | 2 | 1 | 0.4077 | 0.2385 | 0.0657 |
| O18 | O | 2 | 1 | 0.425 | 0.4654 | 0.5745 |
| O19 | O | 2 | 1 | 0.4569 | 0.5063 | 0.1142 |
| O20 | O | 2 | 1 | 0.472 | 0.7862 | 0.1502 |
| O21 | O | 2 | 1 | 0.50 | 0.2483 | 0.3581 |
| O22 | O | 2 | 1 | 0.6404 | 0.0285 | 0.122 |
| O23 | O | 2 | 1 | 0.6587 | 0.3356 | 0.2257 |
| O24 | O | 2 | 1 | 0.7171 | 0.0302 | 0.3985 |
| O25 | O | 2 | 1 | 0.7808 | 0.5096 | 0.1234 |
| O26 | O | 2 | 1 | 0.8007 | 0.2465 | 0.0562 |
| O27 | O | 2 | 1 | 0.9644 | 0.0248 | 0.117 |

TABLE 4

| Coordinate Name ID | Atomic Species S.F. | Site | Occupancy Ratio | x | y | z |
|---|---|---|---|---|---|---|
| In1 | In | 2 | 1.00 | 0.04 | 0.36 | 0.87 |
| In2 | In | 2 | 1.00 | 0.13 | 0.12 | 0.62 |
| In3 | In | 2 | 1.00 | 0.21 | 0.85 | 0.39 |
| In4 | In | 2 | 0.59 | 0.23 | 0.11 | 0.97 |
| Ga4 | Ga | 2 | 0.40 | 0.23 | 0.11 | 0.97 |
| In5 | In | 2 | 1.00 | 0.29 | 0.64 | 0.11 |
| In6 | In | 2 | 1.00 | 0.46 | 0.12 | 0.63 |
| In7 | In | 2 | 1.00 | 0.58 | 0.14 | 0.01 |
| In8 | In | 2 | 1.00 | 0.62 | 0.64 | 0.11 |
| In9 | In | 2 | 1.00 | 0.69 | 0.18 | 0.32 |
| In10 | In | 2 | 0.41 | 0.09 | 0.88 | 0.03 |
| Ga10 | Ga | 2 | 0.59 | 0.09 | 0.88 | 0.03 |
| Ga01 | Ga | 2 | 0.77 | 0.02 | 0.13 | 0.30 |
| Al01 | Al | 2 | 0.23 | 0.02 | 0.13 | 0.30 |
| Ga02 | Ga | 2 | 0.35 | 0.06 | 0.61 | 0.46 |
| Al02 | Al | 2 | 0.65 | 0.06 | 0.61 | 0.46 |
| Ga03 | Ga | 2 | 0.28 | 0.15 | 0.40 | 0.19 |
| Al03 | Al | 2 | 0.72 | 0.15 | 0.40 | 0.19 |
| Ga04 | Ga | 2 | 0.76 | 0.26 | 0.36 | 0.54 |
| Al04 | Al | 2 | 0.24 | 0.26 | 0.36 | 0.54 |
| Ga05 | Ga | 2 | 0.79 | 0.34 | 0.13 | 0.30 |
| Al05 | Al | 2 | 0.21 | 0.34 | 0.13 | 0.30 |
| Ga06 | Ga | 2 | 0.41 | 0.41 | 0.61 | 0.45 |
| Al06 | Al | 2 | 0.59 | 0.41 | 0.61 | 0.45 |
| Ga07 | Ga | 2 | 0.55 | 0.48 | 0.40 | 0.23 |
| Al07 | Al | 2 | 0.45 | 0.48 | 0.40 | 0.23 |
| Ga08 | Ga | 2 | 0.51 | 0.84 | 0.39 | 0.23 |
| Al08 | Al | 2 | 0.49 | 0.84 | 0.39 | 0.23 |

TABLE 5

| Coordinate Name ID | Atomic Species S.F. | Site | Occupancy Ratio | x | y | z |
|---|---|---|---|---|---|---|
| O1 | O | 2 | 1.00 | 0.02 | 0.73 | 0.36 |
| O2 | O | 2 | 1.00 | 0.03 | 0.45 | 0.29 |
| O3 | O | 2 | 1.00 | 0.05 | 0.02 | 0.40 |
| O4 | O | 2 | 1.00 | 0.10 | 0.74 | 0.65 |
| O5 | O | 2 | 1.00 | 0.10 | 0.23 | 0.06 |
| O6 | O | 2 | 1.00 | 0.12 | 0.51 | 0.09 |
| O7 | O | 2 | 1.00 | 0.12 | 0.47 | 0.57 |
| O8 | O | 2 | 1.00 | 0.13 | 0.79 | 0.17 |
| O9 | O | 2 | 1.00 | 0.19 | 0.21 | 0.84 |
| O10 | O | 2 | 1.00 | 0.20 | 0.23 | 0.36 |
| O11 | O | 2 | 1.00 | 0.25 | 0.66 | 0.49 |
| O12 | O | 2 | 1.00 | 0.27 | 0.02 | 0.12 |
| O13 | O | 2 | 1.00 | 0.30 | 0.26 | 0.65 |
| O14 | O | 2 | 1.00 | 0.33 | 0.44 | 0.29 |
| O15 | O | 2 | 1.00 | 0.38 | 0.02 | 0.40 |
| O16 | O | 2 | 1.00 | 0.39 | 0.73 | 0.35 |
| O17 | O | 2 | 1.00 | 0.41 | 0.24 | 0.07 |
| O18 | O | 2 | 1.00 | 0.43 | 0.47 | 0.57 |
| O19 | O | 2 | 1.00 | 0.46 | 0.51 | 0.11 |
| O20 | O | 2 | 1.00 | 0.47 | 0.79 | 0.15 |
| O21 | O | 2 | 1.00 | 0.50 | 0.25 | 0.36 |
| O22 | O | 2 | 1.00 | 0.64 | 0.03 | 0.12 |
| O23 | O | 2 | 1.00 | 0.66 | 0.34 | 0.23 |
| O24 | O | 2 | 1.00 | 0.72 | 0.03 | 0.40 |
| O25 | O | 2 | 1.00 | 0.78 | 0.51 | 0.12 |
| O26 | O | 2 | 1.00 | 0.80 | 0.25 | 0.06 |
| O27 | O | 2 | 1.00 | 0.96 | 0.02 | 0.12 |

Tables 6 and 7 show atomic coordinates of the compound A contained in the oxide sintered body according to Example 1. Table 8 shows the values of atomic coordinates shown in Table 6 in two decimal places. Table 9 shows the values of atomic coordinates shown in Table 7 in two decimal places.

TABLE 6

| Coordinate Name ID | Atomic Species S.F. | Site | Occupancy Ratio | x | y | z |
|---|---|---|---|---|---|---|
| In1 | In | 2 | 1 | 0.04499 | 0.36139 | 0.87288 |
| In2 | In | 2 | 0.809 | 0.12637 | 0.11871 | 0.62239 |
| Ga2 | Ga | 2 | 0.191 | 0.12637 | 0.11871 | 0.62239 |
| In3 | In | 2 | 0.95 | 0.2124 | 0.85274 | 0.38576 |
| Ga3 | Ga | 2 | 0.05 | 0.2124 | 0.85274 | 0.38576 |
| In4 | In | 2 | 0.229 | 0.23539 | 0.11252 | 0.97209 |
| Ga4 | Ga | 2 | 0.771 | 0.23539 | 0.11252 | 0.97209 |
| In5 | In | 2 | 0.997 | 0.28698 | 0.64322 | 0.10774 |
| In6 | In | 2 | 0.903 | 0.45659 | 0.11985 | 0.62529 |
| Ga6 | Ga | 2 | 0.097 | 0.45659 | 0.11985 | 0.62529 |
| In7 | In | 2 | 0.77 | 0.58252 | 0.14152 | 0.00279 |
| Ga7 | Ga | 2 | 0.23 | 0.58252 | 0.14152 | 0.00279 |
| In8 | In | 2 | 1 | 0.6212 | 0.6419 | 0.10781 |
| In9 | In | 2 | 0.456 | 0.68762 | 0.18129 | 0.3151 |
| Ga9 | Ga | 2 | 0.544 | 0.68762 | 0.18129 | 0.3151 |
| In10 | In | 2 | 0.141 | 0.08744 | 0.8802 | 0.03075 |
| Ga10 | Ga | 2 | 0.859 | 0.08744 | 0.8802 | 0.03075 |
| Ga01 | Ga | 2 | 0.834 | 0.0231 | 0.135 | 0.3015 |
| Al01 | Al | 2 | 0.166 | 0.0231 | 0.135 | 0.3015 |
| Ga02 | Ga | 2 | 0.453 | 0.0633 | 0.6078 | 0.4562 |
| Al02 | Al | 2 | 0.547 | 0.0633 | 0.6078 | 0.4562 |
| Ga03 | Ga | 2 | 0.381 | 0.151 | 0.3955 | 0.1982 |
| Al03 | Al | 2 | 0.619 | 0.151 | 0.3955 | 0.1982 |
| Ga04 | Ga | 2 | 0.737 | 0.2624 | 0.367 | 0.5381 |
| Al04 | Al | 2 | 0.263 | 0.2624 | 0.367 | 0.5381 |
| Ga05 | Ga | 2 | 0.833 | 0.343 | 0.1327 | 0.2998 |
| Al05 | Al | 2 | 0.167 | 0.343 | 0.1327 | 0.2998 |
| Ga06 | Ga | 2 | 0.493 | 0.4075 | 0.6108 | 0.4527 |
| Al06 | Al | 2 | 0.507 | 0.4075 | 0.6108 | 0.4527 |
| Ga07 | Ga | 2 | 0.592 | 0.4835 | 0.3977 | 0.2269 |
| Al07 | Al | 2 | 0.408 | 0.4835 | 0.3977 | 0.2269 |
| Ga08 | Ga | 2 | 0.562 | 0.8344 | 0.3938 | 0.229 |
| Al08 | Al | 2 | 0.438 | 0.8344 | 0.3938 | 0.229 |

TABLE 7

| Coordinate Name ID | Atomic Species S.F. | Site | Occupancy Ratio | x | y | z |
|---|---|---|---|---|---|---|
| O1 | O | 2 | 1 | 0.0188 | 0.7347 | 0.3611 |
| O2 | O | 2 | 1 | 0.288 | 0.4483 | 0.2856 |
| O3 | O | 2 | 1 | 0.0494 | 0.0199 | 0.3987 |
| O4 | O | 2 | 1 | 0.0981 | 0.7463 | 0.6486 |
| O5 | O | 2 | 1 | 0.1003 | 0.2329 | 0.0573 |
| O6 | O | 2 | 1 | 0.1211 | 0.504 | 0.0966 |
| O7 | O | 2 | 1 | 0.1221 | 0.4672 | 0.5677 |
| O8 | O | 2 | 1 | 0.1332 | 0.7903 | 0.17 |
| O9 | O | 2 | 1 | 0.192 | 0.2056 | 0.8357 |
| O10 | O | 2 | 1 | 0.2034 | 0.2311 | 0.3577 |
| O11 | O | 2 | 1 | 0.2445 | 0.6624 | 0.4849 |
| O12 | O | 2 | 1 | 0.2733 | 0.0213 | 0.1168 |
| O13 | O | 2 | 1 | 0.2963 | 0.259 | 0.6442 |
| O14 | O | 2 | 1 | 0.3316 | 0.4402 | 0.2913 |
| O15 | O | 2 | 1 | 0.3805 | 0.0171 | 0.3992 |
| O16 | O | 2 | 1 | 0.3825 | 0.7325 | 0.3502 |
| O17 | O | 2 | 1 | 0.41 | 0.2394 | 0.0617 |
| O18 | O | 2 | 1 | 0.4239 | 0.4659 | 0.5731 |
| O19 | O | 2 | 1 | 0.4555 | 0.5087 | 0.1143 |
| O20 | O | 2 | 1 | 0.4706 | 0.7882 | 0.1548 |
| O21 | O | 2 | 1 | 0.5 | 0.2489 | 0.3563 |
| O22 | O | 2 | 1 | 0.6348 | 0.0269 | 0.1215 |
| O23 | O | 2 | 1 | 0.6582 | 0.3367 | 0.2252 |
| O24 | O | 2 | 1 | 0.7179 | 0.256 | 0.3998 |
| O25 | O | 2 | 1 | 0.7814 | 0.5101 | 0.1215 |
| O26 | O | 2 | 1 | 0.7964 | 0.2462 | 0.0567 |
| O27 | O | 2 | 1 | 0.9609 | 0.026 | 0.119 |

TABLE 8

| Coordinate Name ID | Atomic Species S.F. | Site | Occupancy Ratio | x | y | z |
|---|---|---|---|---|---|---|
| In1 | In | 2 | 1.00 | 0.04 | 0.36 | 0.87 |
| In2 | In | 2 | 0.81 | 0.13 | 0.12 | 0.62 |
| Ga2 | Ga | 2 | 0.19 | 0.13 | 0.12 | 0.62 |
| In3 | In | 2 | 0.95 | 0.21 | 0.85 | 0.39 |
| Ga3 | Ga | 2 | 0.05 | 0.21 | 0.85 | 0.39 |
| In4 | In | 2 | 0.23 | 0.24 | 0.11 | 0.97 |
| Ga4 | Ga | 2 | 0.77 | 0.24 | 0.11 | 0.97 |
| In5 | In | 2 | 1.00 | 0.29 | 0.64 | 0.11 |
| In6 | In | 2 | 0.90 | 0.46 | 0.12 | 0.63 |
| Ga6 | Ga | 2 | 0.10 | 0.46 | 0.12 | 0.63 |
| In7 | In | 2 | 0.77 | 0.58 | 0.14 | 0.00 |
| Ga7 | Ga | 2 | 0.23 | 0.58 | 0.14 | 0.00 |
| In8 | In | 2 | 1.00 | 0.62 | 0.64 | 0.11 |
| In9 | In | 2 | 0.46 | 0.69 | 0.18 | 0.32 |
| Ga9 | Ga | 2 | 0.54 | 0.69 | 0.18 | 0.32 |
| In10 | In | 2 | 0.14 | 0.09 | 0.88 | 0.03 |
| Ga10 | Ga | 2 | 0.86 | 0.09 | 0.88 | 0.03 |
| Ga01 | Ga | 2 | 0.83 | 0.02 | 0.14 | 0.30 |
| Al01 | Al | 2 | 0.17 | 0.02 | 0.14 | 0.30 |
| Ga02 | Ga | 2 | 0.45 | 0.06 | 0.61 | 0.46 |
| Al02 | Al | 2 | 0.55 | 0.06 | 0.61 | 0.46 |
| Ga03 | Ga | 2 | 0.38 | 0.15 | 0.40 | 0.20 |
| Al03 | Al | 2 | 0.62 | 0.15 | 0.40 | 0.20 |
| Ga04 | Ga | 2 | 0.74 | 0.26 | 0.37 | 0.54 |
| Al04 | Al | 2 | 0.26 | 0.26 | 0.37 | 0.54 |
| Ga05 | Ga | 2 | 0.83 | 0.34 | 0.13 | 0.30 |
| Al05 | Al | 2 | 0.17 | 0.34 | 0.13 | 0.30 |
| Ga06 | Ga | 2 | 0.49 | 0.41 | 0.61 | 0.45 |
| Al06 | Al | 2 | 0.51 | 0.41 | 0.61 | 0.45 |
| Ga07 | Ga | 2 | 0.59 | 0.48 | 0.40 | 0.23 |
| Al07 | Al | 2 | 0.41 | 0.48 | 0.40 | 0.23 |
| Ga08 | Ga | 2 | 0.56 | 0.83 | 0.39 | 0.23 |
| Al08 | Al | 2 | 0.44 | 0.83 | 0.39 | 0.23 |

TABLE 9

| Coordinate Name ID | Atomic Species S.F. | Site | Occupancy Ratio | x | y | z |
|---|---|---|---|---|---|---|
| O1 | O | 2 | 1.00 | 0.02 | 0.73 | 0.36 |
| O2 | O | 2 | 1.00 | 0.03 | 0.45 | 0.29 |
| O3 | O | 2 | 1.00 | 0.05 | 0.02 | 0.40 |
| O4 | O | 2 | 1.00 | 0.10 | 0.75 | 0.65 |
| O5 | O | 2 | 1.00 | 0.10 | 0.23 | 0.06 |
| O6 | O | 2 | 1.00 | 0.12 | 0.50 | 0.10 |
| O7 | O | 2 | 1.00 | 0.12 | 0.47 | 0.57 |
| O8 | O | 2 | 1.00 | 0.13 | 0.79 | 0.17 |
| O9 | O | 2 | 1.00 | 0.19 | 0.21 | 0.84 |
| O10 | O | 2 | 1.00 | 0.20 | 0.23 | 0.36 |
| O11 | O | 2 | 1.00 | 0.24 | 0.66 | 0.48 |
| O12 | O | 2 | 1.00 | 0.27 | 0.02 | 0.12 |
| O13 | O | 2 | 1.00 | 0.30 | 0.26 | 0.64 |
| O14 | O | 2 | 1.00 | 0.33 | 0.44 | 0.29 |
| O15 | O | 2 | 1.00 | 0.38 | 0.02 | 0.40 |
| O16 | O | 2 | 1.00 | 0.38 | 0.73 | 0.35 |
| O17 | O | 2 | 1.00 | 0.41 | 0.24 | 0.06 |
| O18 | O | 2 | 1.00 | 0.42 | 0.47 | 0.57 |
| O19 | O | 2 | 1.00 | 0.46 | 0.51 | 0.11 |
| O20 | O | 2 | 1.00 | 0.47 | 0.79 | 0.15 |
| O21 | O | 2 | 1.00 | 0.50 | 0.25 | 0.36 |
| O22 | O | 2 | 1.00 | 0.63 | 0.03 | 0.12 |
| O23 | O | 2 | 1.00 | 0.66 | 0.34 | 0.23 |
| O24 | O | 2 | 1.00 | 0.72 | 0.03 | 0.40 |
| O25 | O | 2 | 1.00 | 0.78 | 0.51 | 0.12 |
| O26 | O | 2 | 1.00 | 0.80 | 0.25 | 0.06 |
| O27 | O | 2 | 1.00 | 0.96 | 0.03 | 0.12 |

It has been found from Table 1 that the compound A according to Examples 1, 2, 3 and 4 contains crystalline phases satisfying the range of the defined lattice constants (a, b, c, α, β and γ).

It has been found from Table 1 that the compound A according to Examples 1, 2, 3 and 4 is a compound that can be used to prepare an oxide semiconductor material whose band gap is sufficiently large compared with a typical Si semiconductor.

The invention claimed is:

1. A compound comprising indium element (In), gallium element (Ga), aluminum element (Al) and oxygen element (O), the compound having a triclinic crystal system with lattice constants, wherein the lattice constants are $a=10.07\pm0.15$ Å,
$b=10.45\pm0.15$ Å,
$c=11.01\pm0.15$ Å,
$\alpha=111.70\pm0.50°$,
$\beta=107.70\pm0.50°$ and
$\gamma=90.00\pm0.50°$.

2. The compound according to claim 1, wherein the compound has a space group of P-1 or P1.

3. The compound according to claim 1, wherein the compound has a space group of P-1 and an atomic configuration below, at least one metal in the atomic configuration is any one of In, Ga and Al, or any two or more of In, Ga and Al, and is on the same atomic coordinates at a predetermined ratio, the atomic coordinates on which the at least one metal is arranged are in a range of $x\pm0.01$,
$y\pm0.01$, and
$z\pm0.01$, and atomic coordinates on which oxygen is arranged are in a range of $x\pm0.01$,
$y\pm0.01$, and
$z\pm0.01$, where atomic species: metal, atomic coordinates (x=0.04, y=0.36, z=0.87),
atomic species: metal, atomic coordinates (x=0.13, y=0.12, z=0.62),
atomic species: metal, atomic coordinates (x=0.21, y=0.85, z=0.39),
atomic species: metal, atomic coordinates (x=0.23, y=0.11, z=0.97),
atomic species: metal, atomic coordinates (x=0.29, y=0.64, z=0.11),
atomic species: metal, atomic coordinates (x=0.46, y=0.12, z=0.63),
atomic species: metal, atomic coordinates (x=0.58, y=0.14, z=0.01),
atomic species: metal, atomic coordinates (x=0.62, y=0.64, z=0.11),
atomic species: metal, atomic coordinates (x=0.69, y=0.18, z=0.32),
atomic species: metal, atomic coordinates (x=0.09, y=0.88, z=0.03),
atomic species: metal, atomic coordinates (x=0.02, y=0.13, z=0.30),
atomic species: metal, atomic coordinates (x=0.06, y=0.61, z=0.46),
atomic species: metal, atomic coordinates (x=0.15, y=0.40, z=0.19),
atomic species: metal, atomic coordinates (x=0.26, y=0.36, z=0.54),
atomic species: metal, atomic coordinates (x=0.34, y=0.13, z=0.30),
atomic species: metal, atomic coordinates (x=0.41, y=0.61, z=0.45),
atomic species: metal, atomic coordinates (x=0.48, y=0.40, z=0.23),
atomic species: metal, atomic coordinates (x=0.84, y=0.39, z=0.23),
atomic species: oxygen, atomic coordinates (x=0.02, y=0.73, z=0.36),
atomic species: oxygen, atomic coordinates (x=0.03, y=0.45, z=0.29),
atomic species: oxygen, atomic coordinates (x=0.05, y=0.02, z=0.40),
atomic species: oxygen, atomic coordinates (x=0.10, y=0.74, z=0.65),
atomic species: oxygen, atomic coordinates (x=0.10, y=0.23, z=0.06),
atomic species: oxygen, atomic coordinates (x=0.12, y=0.51, z=0.09),
atomic species: oxygen, atomic coordinates (x=0.12, y=0.47, z=0.57),
atomic species: oxygen, atomic coordinates (x=0.13, y=0.79, z=0.17),
atomic species: oxygen, atomic coordinates (x=0.19, y=0.21, z=0.84),
atomic species: oxygen, atomic coordinates (x=0.20, y=0.23, z=0.36),
atomic species: oxygen, atomic coordinates (x=0.25, y=0.66, z=0.49),
atomic species: oxygen, atomic coordinates (x=0.27, y=0.02, z=0.12),
atomic species: oxygen, atomic coordinates (x=0.30, y=0.26, z=0.65),
atomic species: oxygen, atomic coordinates (x=0.33, y=0.44, z=0.29),
atomic species: oxygen, atomic coordinates (x=0.38, y=0.02, z=0.40),
atomic species: oxygen, atomic coordinates (x=0.39, y=0.73, z=0.35),
atomic species: oxygen, atomic coordinates (x=0.41, y=0.24, z=0.07),
atomic species: oxygen, atomic coordinates (x=0.43, y=0.47, z=0.57),
atomic species: oxygen, atomic coordinates (x=0.46, y=0.51, z=0.11),
atomic species: oxygen, atomic coordinates (x=0.47, y=0.79, z=0.15),
atomic species: oxygen, atomic coordinates (x=0.50, y=0.25, z=0.36),
atomic species: oxygen, atomic coordinates (x=0.64, y=0.03, z=0.12),
atomic species: oxygen, atomic coordinates (x=0.66, y=0.34, z=0.23),
atomic species: oxygen, atomic coordinates (x=0.72, y=0.03, z=0.40),
atomic species: oxygen, atomic coordinates (x=0.78, y=0.51, z=0.12),
atomic species: oxygen, atomic coordinates (x=0.80, y=0.25, z=0.06), and
atomic species: oxygen, atomic coordinates (x=0.96, y=0.02, z=0.12).

4. The compound according to claim 1, wherein the compound has a space group of P1 and has an atomic configuration below, at least one metal in the atomic configuration is any one of In, Ga and Al, or any two or more of In, Ga and Al, and is on the same atomic coordinates at a predetermined ratio, the atomic coordinates on which the at least one metal is arranged are in a range of
x±0.01,
y±0.01, and
z±0.01, and
atomic coordinates on which oxygen is arranged are in a range of
x±0.01,
y±0.01, and
z±0.01, where
atomic species: metal, atomic coordinates (x=0.04, y=0.36, z=0.87),
atomic species: metal, atomic coordinates (x=0.13, y=0.12, z=0.62),
atomic species: metal, atomic coordinates (x=0.21, y=0.85, z=0.39),
atomic species: metal, atomic coordinates (x=0.23, y=0.11, z=0.97),
atomic species: metal, atomic coordinates (x=0.29, y=0.64, z=0.11),
atomic species: metal, atomic coordinates (x=0.46, y=0.12, z=0.63),
atomic species: metal, atomic coordinates (x=0.58, y=0.14, z=0.01)
atomic species: metal, atomic coordinates (x=0.62, y=0.64, z=0.11),
atomic species: metal, atomic coordinates (x=0.69, y=0.18, z=0.32),
atomic species: metal, atomic coordinates (x=0.09, y=0.88, z=0.03),
atomic species: metal, atomic coordinates (x=0.02, y=0.13, z=0.30),
atomic species: metal, atomic coordinates (x=0.06, y=0.61, z=0.46),
atomic species: metal, atomic coordinates (x=0.15, y=0.40, z=0.19),
atomic species: metal, atomic coordinates (x=0.26, y=0.36, z=0.54),
atomic species: metal, atomic coordinates (x=0.34, y=0.13, z=0.30),
atomic species: metal, atomic coordinates (x=0.41, y=0.61, z=0.45),
atomic species: metal, atomic coordinates (x=0.48, y=0.40, z=0.23),
atomic species: metal, atomic coordinates (x=0.84, y=0.39, z=0.23),
atomic species: metal, atomic coordinates (x=0.96, y=0.64, z=0.13),
atomic species: metal, atomic coordinates (x=0.87, y=0.88, z=0.38),
atomic species: metal, atomic coordinates (x=0.79, y=0.15, z=0.61),
atomic species: metal, atomic coordinates (x=0.77, y=0.89, z=0.03),
atomic species: metal, atomic coordinates (x=0.71, y=0.36, z=0.89),
atomic species: metal, atomic coordinates (x=0.54, y=0.88, z=0.37),
atomic species: metal, atomic coordinates (x=0.42, y=0.86, z=0.99),
atomic species: metal, atomic coordinates (x=0.38, y=0.36, z=0.89),
atomic species: metal, atomic coordinates (x=0.31, y=0.82, z=0.68),
atomic species: metal, atomic coordinates (x=0.91, y=0.12, z=0.97),
atomic species: metal, atomic coordinates (x=0.98, y=0.87, z=0.70),
atomic species: metal, atomic coordinates (x=0.94, y=0.39, z=0.54),
atomic species: metal, atomic coordinates (x=0.85, y=0.60, z=0.81),
atomic species: metal, atomic coordinates (x=0.74, y=0.64, z=0.46),
atomic species: metal, atomic coordinates (x=0.66, y=0.87, z=0.70),
atomic species: metal, atomic coordinates (x=0.59, y=0.39, z=0.55),
atomic species: metal, atomic coordinates (x=0.52, y=0.60, z=0.77),
atomic species: metal, atomic coordinates (x=0.16, y=0.61, z=0.77),
atomic species: oxygen, atomic coordinates (x=0.02, y=0.73, z=0.36),
atomic species: oxygen, atomic coordinates (x=0.03, y=0.45, z=0.29),
atomic species: oxygen, atomic coordinates (x=0.05, y=0.02, z=0.40),
atomic species: oxygen, atomic coordinates (x=0.10, y=0.74, z=0.65),
atomic species: oxygen, atomic coordinates (x=0.10, y=0.23, z=0.06),
atomic species: oxygen, atomic coordinates (x=0.12, y=0.51, z=0.09),
atomic species: oxygen, atomic coordinates (x=0.12, y=0.47, z=0.57),
atomic species: oxygen, atomic coordinates (x=0.13, y=0.79, z=0.17),
atomic species: oxygen, atomic coordinates (x=0.19, y=0.21, z=0.84),
atomic species: oxygen, atomic coordinates (x=0.20, y=0.23, z=0.36),
atomic species: oxygen, atomic coordinates (x=0.25, y=0.66, z=0.49),
atomic species: oxygen, atomic coordinates (x=0.27, y=0.02, z=0.12),
atomic species: oxygen, atomic coordinates (x=0.30, y=0.26, z=0.65),
atomic species: oxygen, atomic coordinates (x=0.33, y=0.44, z=0.29),
atomic species: oxygen, atomic coordinates (x=0.38, y=0.02, z=0.40),
atomic species: oxygen, atomic coordinates (x=0.39, y=0.73, z=0.35),
atomic species: oxygen, atomic coordinates (x=0.41, y=0.24, z=0.07),
atomic species: oxygen, atomic coordinates (x=0.43, y=0.47, z=0.57),
atomic species: oxygen, atomic coordinates (x=0.46, y=0.51, z=0.11),
atomic species: oxygen, atomic coordinates (x=0.47, y=0.79, z=0.15),
atomic species: oxygen, atomic coordinates (x=0.50, y=0.25, z=0.36),
atomic species: oxygen, atomic coordinates (x=0.64, y=0.03, z=0.12),
atomic species: oxygen, atomic coordinates (x=0.66, y=0.34, z=0.23),
atomic species: oxygen, atomic coordinates (x=0.72, y=0.03, z=0.40),
atomic species: oxygen, atomic coordinates (x=0.78, y=0.51, z=0.12), atomic species: oxygen, atomic coordinates (x=0.80, y=0.25, z=0.06),
atomic species: oxygen, atomic coordinates (x=0.96, y=0.02, z=0.12),
atomic species: oxygen, atomic coordinates (x=0.98, y=0.27, z=0.64),
atomic species: oxygen, atomic coordinates (x=0.97, y=0.55, z=0.72),
atomic species: oxygen, atomic coordinates (x=0.95, y=0.98, z=0.60),
atomic species: oxygen, atomic coordinates (x=0.90, y=0.26, z=0.35),
atomic species: oxygen, atomic coordinates (x=0.90, y=0.77, z=0.94),
atomic species: oxygen, atomic coordinates (x=0.88, y=0.49, z=0.91),
atomic species: oxygen, atomic coordinates (x=0.88, y=0.53, z=0.43),
atomic species: oxygen, atomic coordinates (x=0.87, y=0.21, z=0.83),
atomic species: oxygen, atomic coordinates (x=0.81, y=0.79, z=0.16),
atomic species: oxygen, atomic coordinates (x=0.80, y=0.77, z=0.64),
atomic species: oxygen, atomic coordinates (x=0.75, y=0.34, z=0.51),
atomic species: oxygen, atomic coordinates (x=0.73, y=0.98, z=0.88),
atomic species: oxygen, atomic coordinates (x=0.70, y=0.74, z=0.35),
atomic species: oxygen, atomic coordinates (x=0.67, y=0.56, z=0.71),
atomic species: oxygen, atomic coordinates (x=0.62, y=0.98, z=0.60),
atomic species: oxygen, atomic coordinates (x=0.61, y=0.27, z=0.65),
atomic species: oxygen, atomic coordinates (x=0.59, y=0.76, z=0.93),
atomic species: oxygen, atomic coordinates (x=0.58, y=0.53, z=0.43),
atomic species: oxygen, atomic coordinates (x=0.54, y=0.49, z=0.89),
atomic species: oxygen, atomic coordinates (x=0.53, y=0.21, z=0.85),
atomic species: oxygen, atomic coordinates (x=0.50, y=0.75, z=0.64),
atomic species: oxygen, atomic coordinates (x=0.36, y=0.97, z=0.88),
atomic species: oxygen, atomic coordinates (x=0.34, y=0.66, z=0.77),
atomic species: oxygen, atomic coordinates (x=0.28, y=0.97, z=0.60),
atomic species: oxygen, atomic coordinates (x=0.22, y=0.49, z=0.88),
atomic species: oxygen, atomic coordinates (x=0.20, y=0.75, z=0.94), and
atomic species: oxygen, atomic coordinates (x=0.04, y=0.98, z=0.88).

* * * * *